US012751227B2

(12) United States Patent
Sato et al.

(10) Patent No.: US 12,751,227 B2
(45) Date of Patent: Sep. 29, 2026

(54) ETCHING METHOD, PLASMA PROCESSING APPARATUS, SUBSTRATE PROCESSING SYSTEM, AND PROGRAM

(71) Applicant: Tokyo Electron Limited, Tokyo (JP)

(72) Inventors: Takuma Sato, Miyagi (JP); Shota Yoshimura, Miyagi (JP); Shinya Morikita, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 775 days.

(21) Appl. No.: 17/865,433

(22) Filed: Jul. 15, 2022

(65) Prior Publication Data

US 2022/0351981 A1 Nov. 3, 2022

Related U.S. Application Data

(63) Continuation-in-part of application No. PCT/JP2021/031030, filed on Aug. 24, 2021.

(Continued)

(30) Foreign Application Priority Data

Sep. 18, 2020 (JP) ................................ 2020-157290
Nov. 5, 2020 (JP) ................................ 2020-185206
Feb. 26, 2021 (JP) ................................ 2021-029988

(51) Int. Cl.
*H10P 50/28* (2026.01)
*H10P 14/60* (2026.01)

(Continued)

(52) U.S. Cl.
CPC ........ *H10P 50/283* (2026.01); *H10P 14/6336* (2026.01); *H10P 14/69215* (2026.01); *H10P 14/69433* (2026.01)

(58) Field of Classification Search
CPC ......... H01L 21/31116; H01L 21/02164; H01L 21/0217; H01L 21/02274
See application file for complete search history.

(56) References Cited

U.S. PATENT DOCUMENTS 9,117,855 B2 * 8/2015 Cho .................. H01J 37/32422
2001/0012694 A1 * 8/2001 Coburn ............ H01L 21/31116
257/E21.252

(Continued)

FOREIGN PATENT DOCUMENTS

CN 109196624 A 1/2019
CN 111463123 A 7/2020

(Continued)

OTHER PUBLICATIONS ip.com search (Year: 2026).*

(Continued)

*Primary Examiner* — Zandra V Smith
*Assistant Examiner* — Andre C Stevenson
(74) *Attorney, Agent, or Firm* — XSENSUS LLP

(57) ABSTRACT

An etching method includes (a) providing a substrate. The substrate includes a first region and a second region. The second region contains silicon oxide, and the first region contains a material different from a material for the second region. The etching method further includes (b) forming a deposit preferentially on the first region with first plasma generated from a first process gas containing a carbon monoxide gas. The etching method further includes (c) etching the second region.

16 Claims, 19 Drawing Sheets

Related U.S. Application Data

(60) Provisional application No. 63/162,739, filed on Mar. 18, 2021.

(51) Int. Cl.
*H10P 14/692* (2026.01)
*H10P 14/694* (2026.01)

(56) References Cited

U.S. PATENT DOCUMENTS

| | | | | |
|---|---|---|---|---|
| 2005/0101093 | A1* | 5/2005 | Cheng | H01L 21/02052 257/E29.267 |
| 2007/0173067 | A1* | 7/2007 | Allen | H01L 21/3081 438/737 |
| 2014/0134846 | A1 | 5/2014 | Hirayama et al. | |
| 2015/0340243 | A1 | 11/2015 | Kikuchi | |
| 2019/0027372 | A1 | 1/2019 | Tsuji et al. | |
| 2020/0032389 | A1* | 1/2020 | Lei | C23C 16/345 |
| 2020/0270749 | A1* | 8/2020 | Li et al. | H01L 21/31116 257/E21.252 |

FOREIGN PATENT DOCUMENTS

| | | | |
|---|---|---|---|
| CN | 112530799 | A | 3/2021 |
| JP | H06-349788 | A | 12/1994 |
| JP | 2000-164571 | A | 6/2000 |
| JP | 2001-291661 | A | 10/2001 |
| JP | 2003-158072 | A | 5/2003 |
| JP | 2006-049885 | A | 2/2006 |
| JP | 2006-514783 | A | 5/2006 |
| JP | 2011-187804 | A | 9/2011 |
| JP | 2017-092376 | A | 5/2017 |
| JP | 2020-096142 | A | 6/2020 |
| JP | 2020-119918 | A | 8/2020 |
| KR | 100255405 | B1 | 6/2000 |
| KR | 2006-0011430 | A | 2/2006 |
| KR | 10-2019-0008226 | A | 1/2019 |
| KR | 2020-0074033 | A | 6/2020 |
| KR | 10-2020-0090133 | A | 7/2020 |
| WO | 2017/199946 | A1 | 11/2017 |
| WO | 2020/040005 | A1 | 2/2020 |

OTHER PUBLICATIONS

Chinese search history (Year: 2302).*
Koren search history (Year: 2026).*
International Search Report and Written Opinion mailed on Oct. 5, 2021, received for PCT Application PCT/JP2021/031030, filed on Aug. 24, 2021, 9 pages including English Translation.

* cited by examiner

W
DPC
DP
R12
R11
R1
R2
UR

ETCHING METHOD, PLASMA PROCESSING APPARATUS, SUBSTRATE PROCESSING SYSTEM, AND PROGRAM

CROSS-REFERENCE TO RELATED APPLICATIONS

The present application is a Continuation-in-Part of International Application PCT/JP2021/031030, filed Aug. 24, 2021, which claims priorities to Japanese Application No. 2020-157290, filed Sep. 18, 2020, Japanese Application No. 2020-185206, filed Nov. 5, 2020, Japanese Application No. 2021-029988, filed Feb. 26, 2021, and claims the benefit of U.S. Provisional Patent Application No. 63/162,739, filed Mar. 18, 2021, the entire contents of each are incorporated herein by reference.

FIELD

Exemplary embodiments of the present disclosure relate to an etching method, a plasma processing apparatus, a substrate processing system, and non-transitory computer program product.

BACKGROUND

Manufacturing electronic devices may perform substrate etching. Etching is to be performed selectively. A second region of a substrate is to be etched selectively, while a first region of the substrate is being protected. Patent Literature references 1 and 2 describe techniques for etching a second region formed from silicon oxide selectively with respect to a first region formed from silicon nitride. The techniques described in the references use a fluorocarbon deposited on the first region and the second region of the substrate. The fluorocarbon deposited on the first region is used for protecting the first region, and the fluorocarbon deposited on the second region is used for etching the second region.

CITATION LIST

Patent Literature

Patent Literature 1: Japanese Unexamined Patent Application Publication No. 2015-173240

Patent Literature 2: Japanese Unexamined Patent Application Publication No. 2016-111177

BRIEF SUMMARY

Technical Problems

The present disclosure is directed to various techniques for etching a second region of a substrate while protecting a first region of the substrate selectively with respect to the second region.

Solutions to Problems

An etching method according to one exemplary embodiment includes (a) providing a substrate. The substrate includes a first region and a second region. The second region contains silicon oxide, and the first region contains a material different from a material for the second region. The etching method further includes (b) forming a deposit preferentially on the first region with first plasma generated from a first process gas containing a carbon monoxide gas. The etching method further includes (c) etching the second region.

Advantageous Effects

The techniques according to the above exemplary embodiment, and other embodiments, allows etching of the second region of the substrate while protecting the first region of the substrate selectively with respect to the second region.

DETAILED DESCRIPTION

Figure 1:
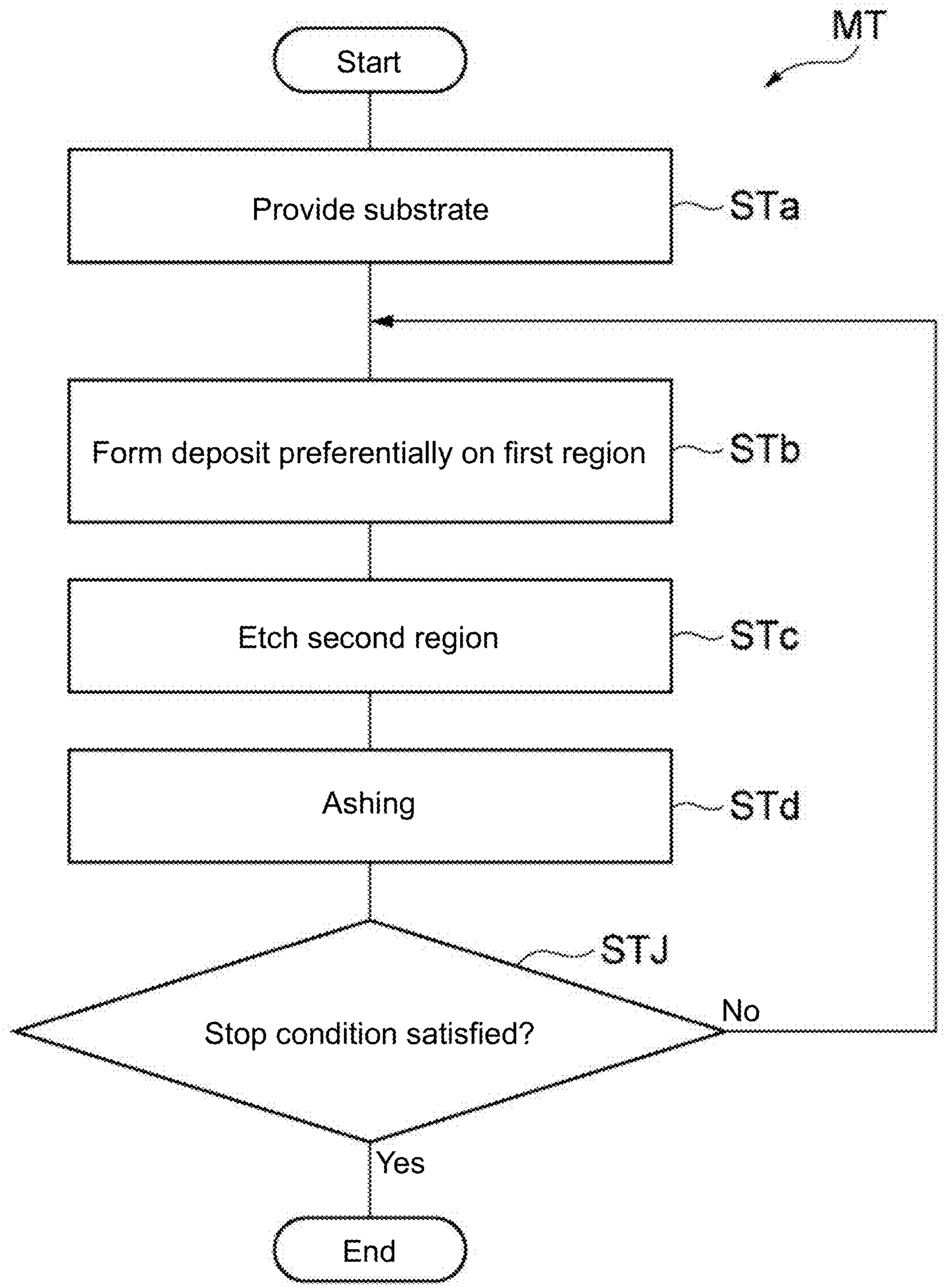
FIG. 1 is a flowchart of an etching method according to an exemplary embodiment.

Exemplary embodiments will now be described.

An etching method according to one exemplary embodiment includes (a) providing a substrate. The substrate includes a first region and a second region. The second region contains silicon oxide, and the first region contains a material different from a material for the second region. The etching method further includes (b) forming a deposit preferentially on the first region with first plasma generated from a first process gas containing a carbon monoxide gas. The etching method further includes (c) etching the second region.

In the above embodiment, a carbon chemical species generated from the first process gas is deposited preferentially on the first region. The carbon chemical species generated from the first process gas is less likely to be deposited on the second region containing oxygen. In the above embodiment, the second region is thus etched with the deposit formed preferentially on the first region. The technique according to the embodiment allows etching of the second region of the substrate while protecting the first region of the substrate selectively with respect to the second region.

In one exemplary embodiment, the second region may contain silicon nitride. Step (c) may include (c1) forming a different deposit containing a fluorocarbon on the substrate with plasma generated from a second process gas containing a fluorocarbon gas. Step (c) may further include (c2) etching the second region by feeding ions in plasma generated from a noble gas to the substrate on which the different deposit is formed.

In one exemplary embodiment, steps (b) and (c) may be repeated alternately.

In one exemplary embodiment, side and bottom portions of the second region R2 may be surrounded by the first region. The second region may be etched in a self-aligned manner in step (c).

In one exemplary embodiment, the first region may include a photoresist mask on the second region.

In one exemplary embodiment, steps (b) and (c) may be performed in a same chamber.

In one exemplary embodiment, step (b) may be performed in a first chamber, and step (c) may be performed in a second chamber.

In one exemplary embodiment, the etching method may further include a step transporting the substrate from the first chamber to the second chamber through a vacuum between steps (b) and (c).

A plasma processing apparatus according to another exemplary embodiment includes a chamber, a substrate support, a plasma generator, and a controller. The substrate support is accommodated in the chamber. The plasma generator generates plasma in the chamber. The controller performs (a) forming a deposit preferentially on a first region of a substrate with first plasma generated from a first process gas containing carbon and being free of fluorine. The controller further performs (b) etching a second region of the substrate.

In one exemplary embodiment, the controller may further perform (c) repeating steps (a) and (b) alternately.

In one exemplary embodiment, step (b) may be performed in a plurality of cycles. Each of the plurality of cycles includes (b1) forming a different deposit containing a fluorocarbon on the substrate with plasma generated from a second process gas containing a fluorocarbon gas. Each of the plurality of cycles further includes (b2) etching the second region by feeding ions in plasma generated from a noble gas to the substrate on which the different deposit is formed.

In one exemplary embodiment, the first process gas may contain a carbon monoxide gas or a carbonyl sulfide gas.

In one exemplary embodiment, the first process gas may contain a carbon monoxide gas and a hydrogen gas.

In one exemplary embodiment, step (a) may be performed at least when a recess defined by the first region and the second region has an aspect ratio of 4 or lower.

In one exemplary embodiment, the first process gas may contain a first component and a second component. The first component contains carbon and is free of fluorine. The second component contains carbon and fluorine or contains carbon and hydrogen. A flow rate of the first component may be greater than a flow rate of the second component.

In one exemplary embodiment, the plasma processing apparatus may further include an upper electrode above the substrate support. The upper electrode may include a ceiling plate exposed to an internal space of the chamber. The ceiling plate may contain a silicon-containing material.

In one exemplary embodiment, the controller may further perform a step of applying a negative direct-current (DC) voltage to the upper electrode during step (a).

In one exemplary embodiment, the controller may further perform a step of forming the silicon-containing deposit on the substrate after step (a) and before step (b). In one exemplary embodiment, the step of forming a silicon-containing deposit on the substrate may include applying a negative DC voltage to the upper electrode while plasma is being generated in the chamber.

In a substrate processing system for processing a substrate according to still another exemplary embodiment, the substrate includes a first region and a second region. The second region contains silicon and oxygen. The first region contains a material free of oxygen and different from a material for the second region. The substrate processing system includes a deposition apparatus, an etching apparatus, and a transfer module. The deposition apparatus forms a deposit preferentially on the first region with first plasma generated from a first process gas containing carbon and being free of fluorine. The etching apparatus etches the second region. The transfer module transfers the substrate through a vacuum between the deposition apparatus and the etching apparatus.

An etching method according to still another exemplary embodiment includes (a) placing a substrate on a substrate support in a chamber in a plasma processing apparatus. The substrate includes a first region and a second region. The second region contains silicon and oxygen. The first region contains a material free of oxygen and different from a material for the second region. The etching method further includes (b) forming a deposit selectively on the first region with a chemical species fed to the substrate. The chemical species is contained in plasma generated from a process gas containing carbon and being free of fluorine. The etching method further includes (c) etching the second region.

In the above embodiment, a carbon chemical species generated from the process gas is deposited selectively on the first region. The carbon chemical species generated from the process gas is less likely to be deposited on the second region containing oxygen. In the above embodiment, the second region is thus etched while the deposit remains selectively on the first region. The technique according to the embodiment allows etching of the second region of the substrate while protecting the first region of the substrate selectively with respect to the second region.

In one exemplary embodiment, the process gas may be free of hydrogen.

In one exemplary embodiment, the process gas may further contain oxygen. The process gas may contain a carbon monoxide gas or a carbonyl sulfide gas.

In one exemplary embodiment, ions fed to the substrate in step (b) may have an energy value of 0 to 70 eV inclusive.

In one exemplary embodiment, the first region may include silicon nitride.

In one exemplary embodiment, side and bottom portions of the second region R2 may include silicon oxide, and may be surrounded by the first region. The second region may be etched in a self-aligned manner in step (c).

In one exemplary embodiment, the first region as a mask may be located on the second region. The second region may include a silicon-containing film.

In one exemplary embodiment, the plasma processing apparatus may be a capacitively coupled plasma processing apparatus. To generate the plasma, step (b) may include providing radio-frequency power to an upper electrode included in the plasma processing apparatus.

In one exemplary embodiment, the radio-frequency power may have a frequency of 60 MHz or higher.

In one exemplary embodiment, the plasma processing apparatus may be an inductively coupled plasma processing apparatus.

In one exemplary embodiment, steps (b) and (c) may be performed in the plasma processing apparatus without removing the substrate from the chamber.

In one exemplary embodiment, the plasma processing apparatus used in step (b) may be different from an etching apparatus used in step (c). The substrate may be transferred from the plasma processing apparatus used in step (b) to the etching apparatus used in step (c) through a vacuum alone.

In one exemplary embodiment, step (b) may be performed at least when a recess defined by the first region and the second region has an aspect ratio of 4 or lower.

In one exemplary embodiment, steps (b) and (c) may be repeated alternately.

An etching method according to still another exemplary embodiment includes (a) placing a substrate on a substrate support in a chamber in a plasma processing apparatus. The substrate includes a first region and a second region. The second region contains silicon and oxygen. The first region contains a material free of oxygen and different from a material for the second region. The etching method further includes (b) forming a deposit selectively on the first region with a chemical species fed to the substrate. The chemical species is contained in plasma generated from a process gas containing a first gas containing carbon and being free of fluorine and a second gas containing carbon and fluorine or containing carbon and hydrogen. The etching method further includes (c) etching the second region. In step (b), the first gas has a greater flow rate than the second gas.

A plasma processing apparatus according to still another exemplary embodiment includes a chamber, a substrate support, a gas supply unit, a plasma generator, and a controller. The substrate support is accommodated in the chamber. The gas supply unit supplies a gas into the chamber. The plasma generator generates plasma from the gas in the chamber. The controller controls the gas supply unit and the plasma generator. The substrate support supports a substrate including a first region and a second region. The second region contains silicon and oxygen. The first region contains a material free of oxygen and different from a material for the second region. The controller controls the gas supply unit and the plasma generator to generate plasma from a process gas containing carbon and being free of fluorine in the chamber to form a deposit selectively on the first region. The controller controls the gas supply unit and the plasma generator to generate plasma from an etching gas in the chamber to etch the second region.

A substrate processing system according to still another exemplary embodiment includes a plasma processing apparatus, an etching apparatus, and a transfer module. The plasma processing apparatus forms a deposit selectively on a first region of a substrate with a chemical species fed to the substrate. The chemical species is contained in plasma generated from a process gas containing carbon and being free of fluorine. The substrate includes the first region and a second region. The second region contains silicon and oxygen. The first region contains a material free of oxygen and different from a material for the second region. The etching apparatus etches the second region. The transfer module transfers the substrate between the plasma processing apparatus and the etching apparatus through a vacuum alone.

Exemplary embodiments will now be described in detail with reference to the drawings. In the drawings, similar or corresponding components are indicated by like reference numerals.

FIG. 1 is a flowchart of an etching method according to an exemplary embodiment. The etching method shown in FIG. 1 (hereinafter referred to as a method MT) starts from step STa. In step STa, a substrate W is provided. In step STa, the substrate W is placed on a substrate support in a plasma processing apparatus. The substrate support is accommodated in a chamber in the plasma processing apparatus.

The substrate W includes a first region R1 and a second region R2. The first region R1 is formed from a material different from a material for the second region R2. The material for the first region R1 may be free of oxygen. The material for the first region R1 may contain silicon nitride. The material for the second region R2 contains silicon and oxygen. The material for the second region R2 may contain silicon oxide. The material for the second region R2 may include a low dielectric constant material containing silicon, carbon, oxygen, and hydrogen.

Figure 2:
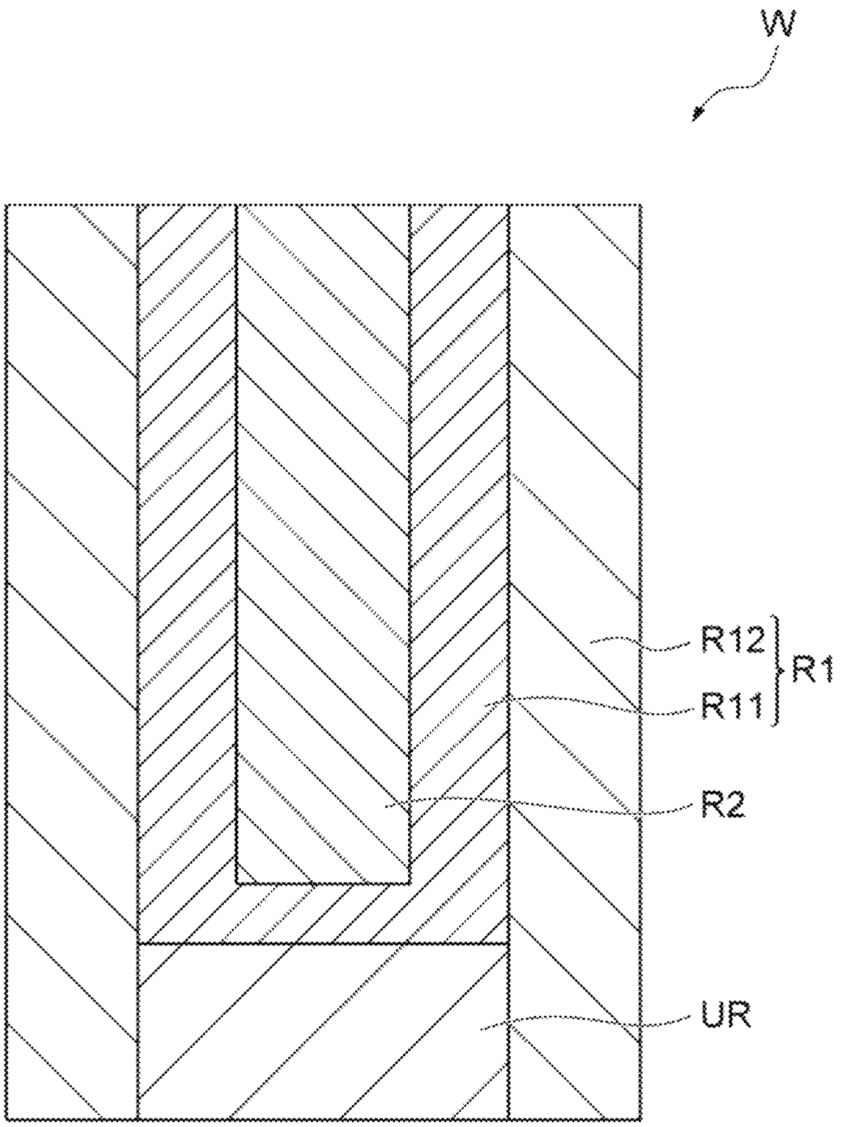
FIG. 2 is a partially enlarged cross-sectional view of an example substrate to be processed with the etching method shown in FIG. 1.

FIG. 2 is a partially enlarged cross-sectional view of an example substrate to be processed with the etching method shown in FIG. 1. The substrate W shown in FIG. 2 includes the first region R1 and the second region R2. The substrate W may further include an underlying region UR. The first region R1 of the substrate W shown in FIG. 2 includes a region R11 and a region R12. The region R11 is formed from silicon nitride and defines a recess (which in this instance means the region R11 extends in a depth direction of the substrate). A footprint of the region R11 is on a corresponding footprint of the underlying region UR. The region R12 extends on either side of the region R11. The region R12 is formed from silicon nitride or silicon carbide. The second region R2 of the substrate W shown in FIG. 2 is formed from silicon oxide and is contained in the recess defined by the region R11 (i.e., a region bounded on both sides and a bottom by R11). In other words, side and bottom portions of the second region R2 are surrounded by the first region R1. When the substrate W shown in FIG. 2 is processed with the method MT, the second region R2 is etched in a self-aligned manner.

Figure 3:
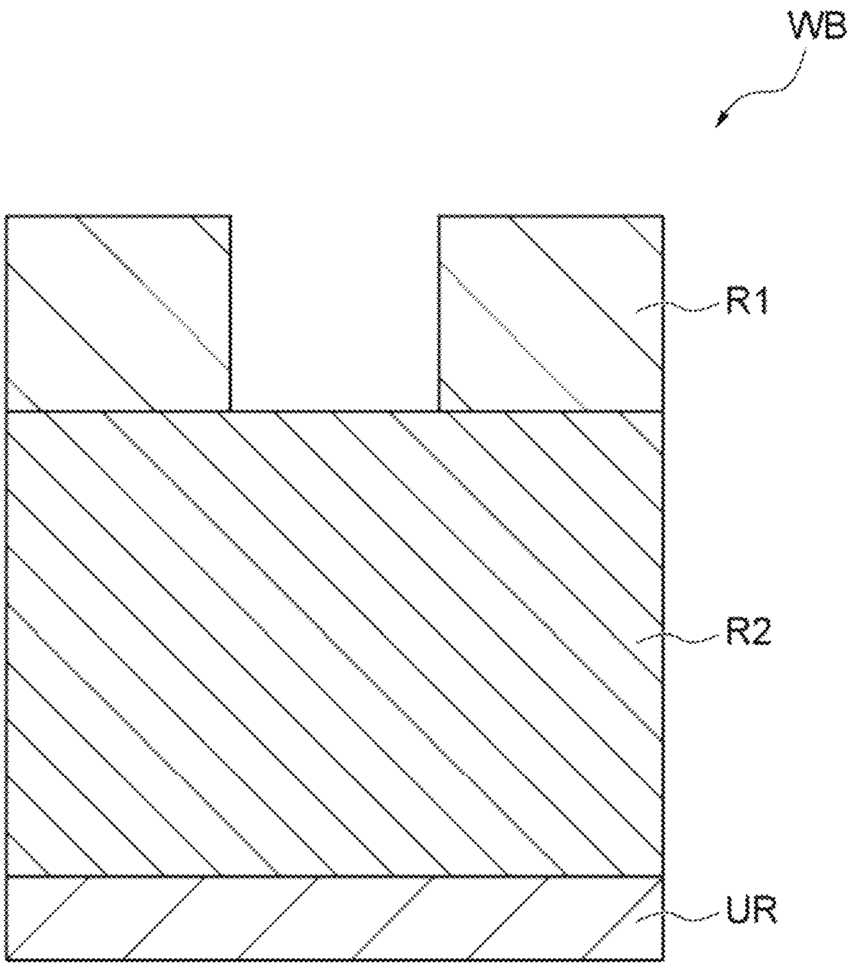
FIG. 3 is a partially enlarged cross-sectional view of another example substrate to be processed with the etching method shown in FIG. 1.

FIG. 3 is a partially enlarged cross-sectional view of another example substrate to be processed with the etching method shown in FIG. 1. A substrate WB shown in FIG. 3 may be used as the substrate W to be processed with the method MT. The substrate WB includes a first region R1 and a second region R2. The first region R1 serves as a mask in the substrate WB. The first region R1 is on the second region R2. The substrate WB may further include an underlying region UR. The second region R2 is on the underlying region UR. In the substrate WB, the first region R1 can be formed from the same material as for the first region R1 of the substrate W shown in FIG. 2. In the substrate WB, the second region R2 can be formed from the same material as for the second region R2 of the substrate W shown in FIG. 2.

Steps subsequent to step STa included in the method MT will now be described using an example substrate W shown in FIG. 2 processed with these steps. FIGS. 4A to 4F will now be referred to in addition to FIG. 1. FIGS. 4A to 4F are partially enlarged cross-sectional views of the example substrate processed through the respective steps included in the etching method shown in FIG. 1.

The method MT includes steps STb and STc performed sequentially after step STa. Steps STb and STc may be performed sequentially after steps STa and STc in this order. Step STc may be followed by step STd. Multiple cycles each including steps STb, STc, and STd may be performed sequentially. In other words, steps STb and STc may be repeated alternately. Step STd may be skipped in some of the multiple cycles.

Figures 4A, 4B, 4C, 4D, 4E, 4F:
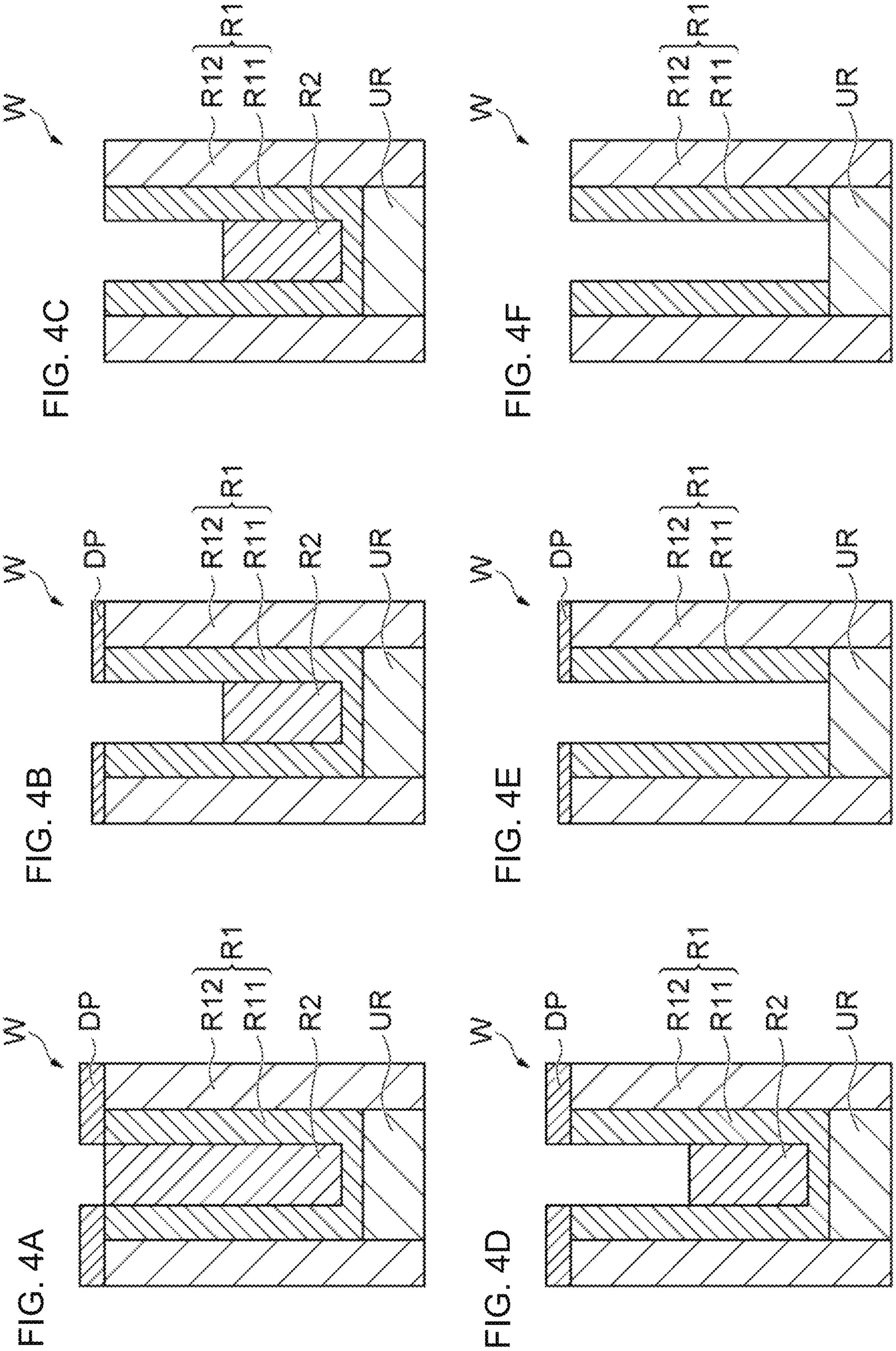
FIGS. 4A to 4F are partially enlarged cross-sectional views of the example substrate processed through the respective steps included in the etching method shown in FIG. 1.

In step STb, a deposit DP is formed selectively or preferentially on the first region R1. In step STb, plasma is generated from a process gas, for example, a first process gas in the chamber in the plasma processing apparatus. The first process gas contains carbon and is free of fluorine. The first process gas contains, as a gas containing carbon and being free of fluorine, for example, a carbon monoxide gas (a CO gas), a carbonyl sulfide gas (a COS gas), or a hydrocarbon gas. The hydrocarbon gas is, for example, a $C_2H_2$ gas, a $C_2H_4$ gas, a $CH_4$ gas, or a $C_2H_6$ gas. The first process gas may be free of hydrogen. The first process gas may further contain a hydrogen gas (an $H_2$ gas) as an additive gas. The first process gas may further contain a noble gas such as an argon gas or a helium gas. The first process gas may further contain an inert gas such as a nitrogen gas (an $N_2$ gas) in addition to or instead of the noble gas. In the first process gas, the flow rate of the gas containing carbon and being free of fluorine may be 30 to 200 sccm inclusive. In the first process gas, the flow rate of the gas containing carbon and being free of fluorine may be 90 to 130 sccm inclusive. In the first process gas, the flow rate of the noble gas may be 0 to 1000 sccm inclusive. In the first process gas, the flow rate of the noble gas may be 350 sccm or less. The flow rate of each gas in the first process gas can be determined by the volume of an internal space 10*s* in a chamber 10. In step STb, a chemical species (carbon chemical species) contained in the plasma is fed to the substrate. The fed chemical species forms the deposit DP selectively or preferentially on the first region R1 as shown in FIG. 4A. The deposit DP contains carbon.

In step STb, the first process gas may contain the first gas and the second gas. The first gas contains carbon and is free of fluorine. Examples of such a gas include a CO gas and a COS gas. In other words, the first process gas may contain a first component that contains carbon and is free of fluorine. The first component is, for example, carbon monoxide (CO) or carbonyl sulfide. The second gas contains carbon and fluorine or contains carbon and hydrogen. Examples of such a gas include a hydrofluorocarbon gas, a fluorocarbon gas, and a hydrocarbon gas. In other words, the first process gas may further contain a second component that contains carbon and fluorine or contains carbon and hydrogen. The second component is, for example, hydrofluorocarbon, fluorocarbon, or hydrocarbon. The hydrofluorocarbon gas is, for example, a $CHF_3$ gas, a $CH_3F$ gas, or a $CH_2F_2$ gas. The fluorocarbon gas is, for example, a $C_4F_6$ gas. The second gas containing carbon and hydrogen is, for example, a $CH_4$ gas. The flow rate of the first gas or the first component is greater than that of the second gas or the second component. The ratio of the flow rate of the second gas or the second component to the flow rate of the first gas or the first component may be 0.2 or less. In step STb using the first process gas, a thin protective film is formed on side walls defining the recess in addition to the selective or preferential formation of the deposit DP on the first region R1. The side walls are thus protected from the plasma.

The first process gas used in step STb may be a mixture of a CO gas and a hydrogen gas (an $H_2$ gas). The first process gas allows the deposit DP to form a protective film that is highly resistant to etching in step STc selectively or preferentially on the first region R1. The ratio of the flow rate of the $H_2$ gas to the total flow rate of the CO gas and the $H_2$ gas contained in the first process gas may be $1/19$ to $2/17$ inclusive. When the first process gas having such a ratio is used, the deposit DP formed on the first region R1 has a side surface with higher verticality.

In step STb, ions fed to the substrate W may have an energy value of 0 to 70 eV inclusive. In this case, the deposit DP is less likely to narrow the opening of the recess.

In one embodiment, the plasma processing apparatus used in step STb may be a capacitively coupled plasma processing apparatus. When a capacitively coupled plasma processing apparatus is used, radio-frequency (RF) power for generating plasma may be provided to an upper electrode. In this case, the plasma can be formed in an area distant from the substrate W. The RF power may have a frequency of 60 MHz or higher. In another embodiment, the plasma processing apparatus used in step STb may be an inductively coupled plasma processing apparatus.

In step STb, the deposit DP can be formed selectively or preferentially on the first region R1. Step STb can thus be performed at least when the recess defined by the first region R1 and the second region R2 of the substrate W has an aspect ratio of 4 or lower.

In subsequent step STc, the second region R2 is etched as shown in FIG. 4B. In one embodiment, the second region R2 is etched using a chemical species contained in plasma generated from an etching gas. In this case, the plasma is generated from the etching gas in a chamber in an etching apparatus. The etching gas is selected in accordance with the material for the second region R2. The etching gas may contain, for example, a fluorocarbon gas. The etching gas may further contain a noble gas such as an argon gas and an oxygen-containing gas such as an oxygen gas.

The plasma processing apparatus used in step STb may be used as the etching apparatus used in step STc. In other words, steps STb and STc may be performed in the same chamber. In this case, steps STb and STc are performed without removing the substrate W from the chamber in the plasma processing apparatus. In some embodiments, the plasma processing apparatus used in step STb may be different from the etching apparatus used in step STc. In other words, step STb may be performed in a first chamber, and step STc may be performed in a second chamber. In this case, the substrate W is transferred from the plasma processing apparatus used in step STb to the etching apparatus used in step STc through a vacuum alone between steps STb and STc. In other words, the substrate W is transferred from the first chamber to the second chamber through a vacuum between steps STb and STc.

In subsequent step STd, ashing is performed. In step STd, the deposit DP is removed as shown in FIG. 4C. In one embodiment, the deposit DP is etched using a chemical species contained in plasma generated from an ashing gas. In this case, the plasma is generated from the ashing gas in a chamber in an ashing apparatus. The ashing gas contains an oxygen-containing gas, such as an oxygen gas. The ashing gas may be a mixture containing an $N_2$ gas and an $H_2$ gas. Step STd may be eliminated from the method MT.

The etching apparatus used in step STc may be used as the ashing apparatus in step STd. In other words, steps STc and STd may be performed in the same chamber. In this case, steps STc and STd are performed without removing the substrate W from the chamber in the etching apparatus. In some embodiments, the etching apparatus used in step STc may be different from the ashing apparatus used in step STd. In other words, the chamber used in step STd may be different from the chamber used in step STc. In this case, the substrate W is transferred from the etching apparatus used in step STc to the ashing apparatus used in step STd through a vacuum alone between steps STc and STd. In other words, the substrate W is transferred from the chamber for step STc to the chamber for step STd through a vacuum between steps STc and STd. The ashing apparatus used in step STd may be the plasma processing apparatus used in step STb.

When multiple cycles are performed sequentially with the method MT, step STJ is then performed. In step STJ, the determination is performed as to whether a stop condition is satisfied. In step STJ, the stop condition is satisfied when the count of the cycles performed reaches a predetermined number. When the stop condition is not satisfied in step STJ, such cycles are restarted. More specifically, step STb is performed again to form a deposit DP on the first region R1 as shown in FIG. 4D. Step STc is then performed to etch the second region R2 as shown in FIG. 4E. With the method MT, the first region R1 may be removed at the bottom of the recess in step STc as shown FIG. 4E. Step STd is then performed to remove the deposit DP as shown in FIG. 4F. When the stop condition is satisfied in step STJ, the method MT ends.

The carbon chemical species generated from the first process gas in step STb in the method MT forms a deposit selectively or preferentially on the first region R1. The carbon chemical species generated from the first process gas is less likely to form a deposit on the second region R2 containing oxygen. With the method MT, the second region R2 is etched with the deposit DP formed preferentially on the first region R1. The method MT thus allows the second region R2 to be etched while protecting the first region R1 selectively with respect to the second region R2. With the method MT, the deposit DP is formed selectively or preferentially on the first region R1. This reduces blockage of the opening of the recess defined by the first region R1 and the second region R2.

A carbon chemical species generated from a CO gas in step STb is ionic. A $CH_4$ gas or a $CH_3F$ gas tends to generate radicals such as $CH_2$ or CHF. These radicals are highly reactive and easily deposited isotropically on the surface of the substrate W. In contrast, an ionic chemical species is deposited on the substrate W anisotropically. In other words, an ionic chemical species adheres more to the upper surface of the first region R1 than to the wall surfaces defining the recess. Carbon monoxide is likely to be released from the surface of the substrate W. To cause carbon monoxide to be adsorbed on the surface of the substrate W, oxygen is to be removed from the surface of the substrate W with ions striking the surface. In addition, carbon monoxide with a simple structure is difficult to cross-link. To cause carbon monoxide to be deposited on the surface of the substrate W, a dangling bond is to form on the surface of the substrate W. The carbon chemical species generated from the CO gas in step STb is ionic. The chemical species can thus remove oxygen from the upper surface of the first region R1, form a dangling bond on the upper surface, and be deposited selectively on the first region R1.

Figure 5:
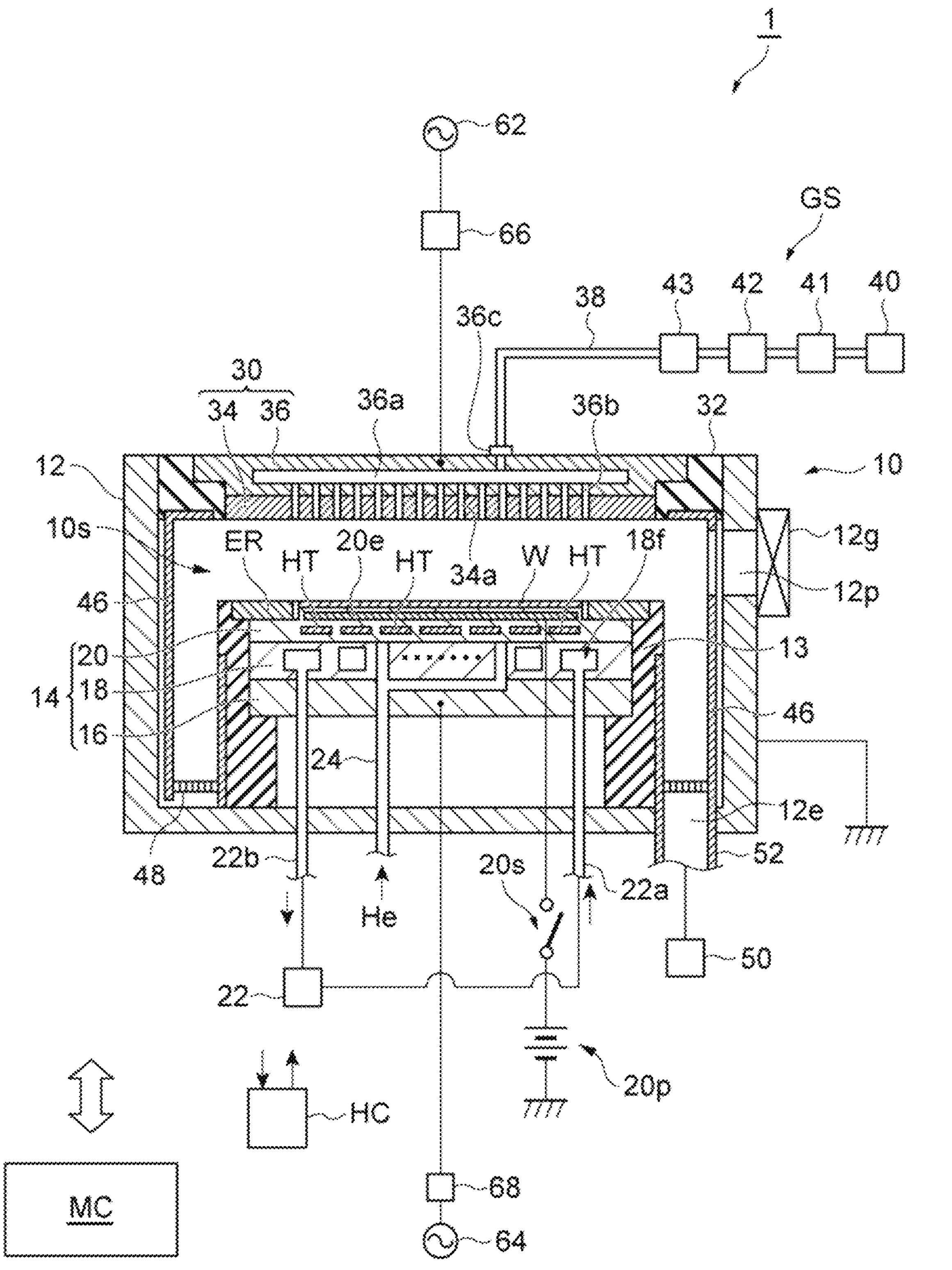
FIG. 5 is a schematic diagram of a plasma processing apparatus according to an exemplary embodiment.

FIG. 5 is a schematic diagram of a plasma processing apparatus according to an exemplary embodiment. A plasma processing apparatus 1 shown in FIG. 5 may be used with the method MT. The plasma processing apparatus 1 may be used either in all the steps included in the method MT or in step STb alone.

The plasma processing apparatus 1 is a capacitively coupled plasma processing apparatus. The plasma processing apparatus 1 includes the chamber 10. The chamber 10 has the internal space 10*s*.

In one embodiment, the chamber 10 may include a chamber body 12. The chamber body 12 is substantially cylindrical. The chamber body 12 has the internal space 10*s*. The chamber body 12 is formed from a conductor such as aluminum. The chamber body 12 is grounded. The chamber body 12 has an inner wall coated with an anticorrosive film. The anticorrosive film may be formed from ceramic such as aluminum oxide or yttrium oxide.

The chamber body 12 has a side wall having a port 12*p*. The substrate W is transferred between the internal space 10*s* and the outside of the chamber 10 through the port 12*p*. The port 12*p* can be open and closed by a gate valve 12*g*. The gate valve 12*g* is located along the side wall of chamber body 12.

The plasma processing apparatus 1 further includes a substrate support 14. The substrate support 14 supports the substrate W in the chamber 10, or more specifically, in the internal space 10*s*. The substrate support 14 is accommodated in the chamber 10. The substrate support 14 may be supported by a support 13. The support 13 is formed from an insulating material. The support 13 is substantially cylindrical. The support 13 extends upward from the bottom of the chamber body 12 into the internal space 10*s*.

In one embodiment, the substrate support 14 may include a lower electrode 18 and an electrostatic chuck (ESC) 20. The substrate support 14 may further include an electrode plate 16. The electrode plate 16 is substantially disk-shaped and is formed from a conductor such as aluminum. The lower electrode 18 is on the electrode plate 16. The lower electrode 18 is formed from a conductor such as aluminum and is substantially disk-shaped. The lower electrode 18 is electrically coupled to the electrode plate 16.

The ESC 20 is on the lower electrode 18. The substrate W is placed on an upper surface of the ESC 20. The ESC 20 has a body formed from a dielectric. The body of the ESC 20 is substantially disk-shaped. The ESC 20 further includes an electrode 20*e*. The electrode 20*e* is located in the body of the ESC 20. The electrode 20*e* is a film electrode. The electrode 20*e* is coupled to a DC power supply 20*p* through a switch 20*s*. A voltage is applied from the DC power supply 20*p* to the electrode in the ESC 20 to generate an electrostatic attraction between the ESC 20 and the substrate W. The electrostatic attraction causes the ESC 20 to attract and hold the substrate W.

The substrate support 14 may support an edge ring ER placed on it. The edge ring ER may be formed from, but not limited to, silicon, silicon carbide, or quartz. To process the substrate W in the chamber 10, the substrate W is placed in an area on the ESC 20 surrounded by the edge ring ER.

The lower electrode 18 has an internal channel 18*f*. The channel 18*f* carries a heat exchange medium (e.g., a refrigerant) supplied from a chiller unit 22 through a pipe 22*a*. The chiller unit 22 is located outside the chamber 10. The heat-exchange medium being supplied to the channel 18*f* returns to the chiller unit 22 through a pipe 22*b*. In the plasma processing apparatus 1, the temperature of the substrate Won the ESC 20 is adjusted through heat exchange between the heat-exchange medium and the lower electrode 18.

The temperature of the substrate W may be adjusted by one or more heaters inside the substrate support 14. Multiple heaters HT are located in the ESC 20 in the example shown in FIG. 5. Each of the multiple heaters HT may be a resistance heating element. The multiple heaters HT are coupled to a heater controller HC. The heater controller HC can provide a regulated amount of power to each of the heaters HT.

The plasma processing apparatus 1 may further include a gas supply line 24. The gas supply line 24 supplies a heat-transfer gas (e.g., a He gas) into a space between the upper surface of the ESC 20 and the back surface of the substrate W. The heat-transfer gas is supplied from a heat-transfer gas supply assembly to the gas supply line 24.

The plasma processing apparatus 1 further includes an upper electrode 30. The upper electrode 30 is located above the substrate support 14. The upper electrode 30 is supported on an upper portion of the chamber body 12 with a member 32. The member 32 is formed from an insulating material. The upper electrode 30 and the member 32 close a top opening of the chamber body 12.

The upper electrode 30 may include a ceiling plate 34 and a support member 36. The ceiling plate 34 has its lower surface defining the internal space 10*s*. In other words, the ceiling plate 34 is exposed to the internal space 10*s*. The ceiling plate 34 may be formed from a silicon-containing material. The ceiling plate 34 is, for example, formed from silicon or silicon carbide. The ceiling plate 34 has multiple gas holes 34*a*. The multiple gas holes 34*a* are through-holes in the thickness direction of the ceiling plate 34.

The support member 36 supports the ceiling plate 34 in a detachable manner. The support member 36 is formed from a conductive material such as aluminum. The support member 36 includes an internal gas-diffusion compartment 36*a*. The support member 36 further has multiple gas holes 36*b*. The gas holes 36*b* extend downward from the gas-diffusion compartment 36*a*. The gas holes 36*b* communicate with the respective gas holes 34*a*. The support member 36 further has a gas inlet 36*c*. The gas inlet 36*c* connects to the gas-diffusion compartment 36*a*. The gas inlet 36*c* also connects to a gas supply pipe 38.

The gas supply pipe 38 is connected to a set of gas sources 40 with a set of valves 41, a set of flow controllers 42, and a set of valves 43. The gas source set 40, the valve set 41, the flow controller set 42, and the valve set 43 are included in a gas supply unit GS.

The gas source set 40 includes multiple gas sources. When the plasma processing apparatus 1 is used in step STb, the gas sources include one or more gas sources for the first process gas used in step STb. When the plasma processing apparatus 1 is used in step STc, the gas sources include one or more gas sources for the etching gas used in step STc. When the plasma processing apparatus 1 is used in step STd, the gas sources include one or more gas sources for the ashing gas used in step STd.

The valve sets 41 and 43 each include multiple open-close valves. The flow controller set 42 includes multiple flow controllers. The flow controllers in the flow controller set 42 are mass flow controllers or pressure-based flow controllers. The gas sources in the gas source set 40 are connected to the gas supply pipe 38 with the respective open-close valves in the valve set 41, with the respective flow controllers in the flow controller set 42, and with the respective open-close valves in the valve set 43.

The plasma processing apparatus 1 may further include a shield 46. The shield 46 is located along the inner wall of the chamber body 12 in a detachable manner. The shield 46 also extends along the outer periphery of the support 13. The shield 46 prevents byproducts from the plasma processing from accumulating on the chamber body 12. The shield 46 includes, for example, an aluminum member coated with an anticorrosive film. The anticorrosive film may be a film of ceramic such as yttrium oxide.

The plasma processing apparatus 1 may further include a baffle 48. The baffle 48 is located between the support 13 and the side wall of the chamber body 12. The baffle 48 includes, for example, an aluminum plate coated with an anticorrosive film. The anticorrosive film may be a film of ceramic such as yttrium oxide. The baffle 48 has multiple through-holes. The chamber body 12 has an outlet 12*e* in its bottom below the baffle 48. The outlet 12*e* is connected to an exhaust device 50 through an exhaust pipe 52. The exhaust device 50 includes a pressure control valve and a vacuum pump such as a turbomolecular pump.

The plasma processing apparatus 1 further includes an RF power supply 62 and a bias power supply 64. The RF power supply 62 generates RF power (hereinafter referred to as RF power HF). The RF power HF has a frequency suitable for generating plasma. The RF power HF has a frequency ranging from, for example, 27 to 100 MHz inclusive. The RF power HF may have a frequency of 60 MHz or higher. The RF power supply 62 is coupled to an RF electrode through a matcher 66. In one embodiment, the RF electrode is the upper electrode 30. The matcher 66 includes a circuit for matching the impedance of a load (the upper electrode 30) for the RF power supply 62 and the output impedance of the RF power supply 62. In one embodiment, the RF power supply 62 may serve as a plasma generator. The RF power supply 62 may be coupled to an electrode in the substrate support 14 (e.g., the lower electrode 18) through the matcher 66. In other words, the RF electrode may be the electrode in the substrate support 14 (e.g., the lower electrode 18).

The bias power supply 64 applies an electrical bias EB to a bias electrode (e.g., the lower electrode 18) in the substrate support 14. The electrical bias EB has a bias frequency suitable for drawing ions toward the substrate W. The electrical bias EB has a bias frequency of, for example, 100 kHz to 40.68 MHz inclusive. When the electrical bias EB is used with the RF power HF, the electrical bias EB has a lower frequency than the RF power HF.

In one embodiment, the electrical bias EB may be RF bias power (hereinafter referred to as RF power LF). The RF power LF has a sinusoidal waveform with a bias frequency. In this embodiment, the bias power supply 64 is coupled to a bias electrode (e.g., the lower electrode 18) through a matcher 68 and the electrode plate 16. The matcher 68 includes a circuit for matching the impedance of a load (the lower electrode 18) for the bias power supply 64 and the output impedance of the bias power supply 64. In another embodiment, the electrical bias EB may be a pulsed voltage. The pulsed voltage may be a pulsed negative voltage. The pulsed negative voltage may be a pulsed negative DC voltage. In this embodiment, a pulsed voltage is periodically applied to the lower electrode 18 at time intervals (e.g., periods) having a time length that is the inverse of the bias frequency.

The plasma processing apparatus 1 further includes a controller MC. The controller MC may be a computer including a processor (such as a CPU that is an example of circuitry that can be configured by software to perform operations according to the software instructions), a storage such as a memory, an input device, a display, and an input-output interface for signals. Alternatively, the controller may include more than one processor, including cloud computer resources, as well as discrete circuitry such application specific integrated circuits (ASIC), programmable logic arrays (PLA), and/or combinations of the examples of discrete and programmable circuitry. The controller MC controls the components of the plasma processing apparatus 1. An operator can use an input device (e.g., user interface such as keyboard, touch panel, and the like) in the controller MC to input a command or perform other operations for managing the plasma processing apparatus 1. The display in the controller MC can display and visualize the operating state of the plasma processing apparatus 1. The storage in the controller MC stores control programs and recipe data. The control program is executed by the processor in the controller MC to perform the processing in the plasma processing apparatus 1. The processor in the controller MC executes the control program to control the components of the plasma processing apparatus 1 in accordance with the recipe data, allowing at least a step or all the steps included in the method MT to be performed by the plasma processing apparatus 1.

The controller MC may perform step STb. When step STb is performed in the plasma processing apparatus 1, the controller MC controls the gas supply unit GS to supply the first process gas into the chamber 10. The controller MC also controls the exhaust device 50 to maintain the chamber 10 at a specified gas pressure. The controller MC also controls the plasma generator to generate plasma from the first process gas in the chamber 10. More specifically, the controller MC controls the RF power supply 62 to provide RF power HF. The controller MC may also control the bias power supply 64 to apply an electrical bias EB.

The controller MC may further perform step STc. When step STc is performed in the plasma processing apparatus 1, the controller MC controls the gas supply unit GS to supply the etching gas into the chamber 10. The controller MC also controls the exhaust device 50 to maintain the chamber 10 at a specified gas pressure. The controller MC also controls the plasma generator to generate plasma from the etching gas in the chamber 10. More specifically, the controller MC controls the RF power supply 62 to provide RF power HF. The controller MC may also control the bias power supply 64 to apply an electrical bias EB.

The controller MC may further perform step STd. When step STd is performed in the plasma processing apparatus 1, the controller MC controls the gas supply unit GS to supply the ashing gas into the chamber 10. The controller MC also controls the exhaust device 50 to maintain the chamber 10 at a specified gas pressure. The controller MC also controls the plasma generator to generate plasma from the ashing gas in the chamber 10. More specifically, the controller MC controls the RF power supply 62 to provide RF power HF. The controller MC may also control the bias power supply 64 to apply an electrical bias EB.

The controller MC may further perform the multiple cycles described above sequentially. The controller MC may further repeat steps STb and STc alternately.

Figure 6:
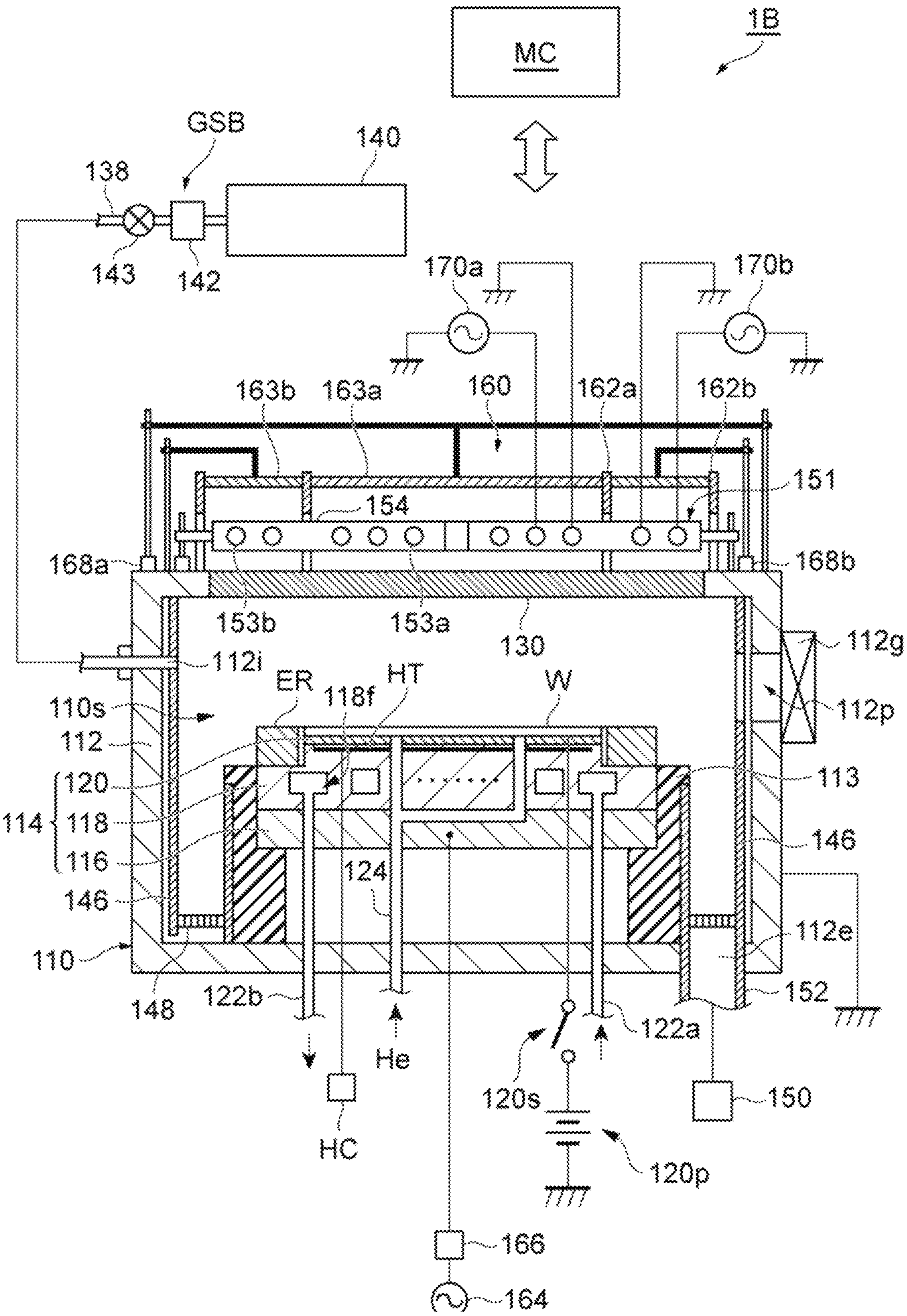
FIG. 6 is a schematic diagram of a plasma processing apparatus according to another exemplary embodiment.

FIG. 6 is a schematic diagram of a plasma processing apparatus according to another exemplary embodiment. The plasma processing apparatus used with the method MT may be an inductively coupled plasma processing apparatus such as a plasma processing apparatus 1B shown in FIG. 6. The plasma processing apparatus 1B may be used either in all the steps included in the method MT or in step STb alone.

The plasma processing apparatus 1B includes a chamber 110. The chamber 110 has an internal space 110*s*. In one embodiment, the chamber 110 may include a chamber body 112. The chamber body 112 is substantially cylindrical. The chamber body 112 has the internal space 110*s*. The chamber body 112 is formed from a conductor such as aluminum. The chamber body 112 is grounded. The chamber body 112 has an inner wall coated with an anticorrosive film. The anticorrosive film may be formed from ceramic such as aluminum oxide or yttrium oxide.

The chamber body 112 has a side wall having a port 112*p*. The substrate W is transferred between the internal space 110*s* and the outside of the chamber 110 through the port 112*p*. The port 112*p* can be open and closed by a gate valve 112*g*. The gate valve 112*g* is located along the side wall of the chamber body 112.

The plasma processing apparatus 1B further includes a substrate support 114. The substrate support 114 supports the substrate W in the chamber 110, or more specifically, in the internal space 110*s*. The substrate support 114 is accommodated in the chamber 110. The substrate support 114 may be supported by a support 113. The support 113 is formed from an insulating material. The support 113 is substantially cylindrical. The support 113 extends upward from the bottom of the chamber body 112 in the internal space 110*s*.

In one exemplary embodiment, the substrate support 114 may include a lower electrode 118 and an ESC 120. The substrate support 114 may further include an electrode plate 116. The electrode plate 116 is substantially disk-shaped and is formed from a conductive material such as aluminum. The lower electrode 118 is on the electrode plate 116. The lower electrode 118 is substantially disk-shaped and is formed from a conductive material such as aluminum. The lower electrode 118 is electrically coupled to the electrode plate 116.

The plasma processing apparatus 1B further includes a bias power supply 164. The bias power supply 164 is coupled to a bias electrode (e.g., the lower electrode 118) in the substrate support 114 through a matcher 166. The bias power supply 164 and the matcher 166 are similar to the bias power supply 64 and the matcher 66 in the plasma processing apparatus 1.

The ESC 120 is on the lower electrode 118. The ESC 120 includes a body and an electrode, similarly to the ESC 20 in the plasma processing apparatus 1. The electrode in the ESC 120 is coupled to a DC power supply 120*p* through a switch 120*s*. A voltage is applied from the DC power supply 120*p* to the electrode in the ESC 120 to generate an electrostatic attraction between the ESC 120 and the substrate W. The electrostatic attraction causes the ESC 120 to attract and hold the substrate W.

The lower electrode 118 has an internal channel 118*f*. The channel 118*f* carries a heat exchange medium supplied from a chiller unit through a pipe 122*a* similarly to the channel 18*f* in the plasma processing apparatus 1. The heat-exchange medium being supplied to the channel 118*f* returns to the chiller unit through a pipe 122*b*.

The substrate support 114 may support an edge ring ER placed on it, similarly to the substrate support 14 in the plasma processing apparatus 1. The substrate support 114 may also include one or more heaters HT inside, similarly to the substrate support 14 in the plasma processing apparatus 1. The heater(s) HT is connected to a heater controller HC. The heater controller HC can provide a regulated amount of power to the heater(s) HT.

The plasma processing apparatus 1B may further include a gas supply line 124. The gas supply line 124 supplies a heat-transfer gas (e.g., a He gas) into a space between the upper surface of the ESC 120 and the back surface of the substrate W, similarly to the gas supply line 24 in the plasma processing apparatus 1.

The plasma processing apparatus 1B may further include a shield 146. The shield 146 is similar to the shield 46 in the plasma processing apparatus 1. The shield 146 is located along the inner wall of the chamber body 112 in a detachable manner. The shield 146 also extends along the outer periphery of the support 113.

The plasma processing apparatus 1B may further include a baffle 148. The baffle 148 is similar to the baffle 48 in the plasma processing apparatus 1. The baffle 148 is located between the support 113 and the side wall of the chamber body 112. The chamber body 112 has an outlet 112*e* in its bottom below the baffle 148. The outlet 112*e* is connected to an exhaust device 150 through an exhaust pipe 152. The exhaust device 150 includes a pressure control valve and a vacuum pump such as a turbomolecular pump.

The chamber body 112 defines an opening in its top surface. The opening in the top surface of the chamber body 112 is covered with a window 130. The window 130 is formed from a dielectric such as quartz. The window 130 is, for example, plate-shaped. For example, the distance between the lower surface of the window 130 and the upper surface of the substrate W placed on the ESC 120 is set to be 120 to 180 mm.

The chamber 110 or the chamber body 112 has a gas inlet 112*i* on its side wall. The gas inlet 112*i* connects to a gas supply unit GSB through a gas supply pipe 138. The gas supply unit GSB includes a set of gas sources 140, a set of flow controllers 142, and a set of valves 143. The gas source set 140, similar to the gas source set 40 in the plasma processing apparatus 1, includes multiple gas sources. The flow controller set 142 is similar to the flow controller set 42 in the plasma processing apparatus 1. The valve set 143 is similar to the valve set 43 in the plasma processing apparatus 1. The gas sources in the gas source set 140 are connected to the gas supply pipe 138 through the respective flow controllers in the flow controller set 142 and with the respective open-close valves in the valve set 143. The gas inlet 112*i* may be formed in another portion, such as in the window 130, instead of the side wall of the chamber body 112.

The plasma processing apparatus 1B further includes an antenna 151 and a shield 160. The antenna 151 and the shield 160 are located above the top surface of the chamber 110 and above the window 130. The antenna 151 and the shield 160 are outside the chamber 110. In one embodiment, the antenna 151 includes inner antenna elements 153*a* and outer antenna elements 153*b*. Each inner antenna element 153*a* is a spiral coil extending across a middle portion of the window 130. Each outer antenna element 153*b* is a spiral coil extending above the window 130 and outside the corresponding inner antenna element 153*a*. The inner antenna element 153*a* and the outer antenna element 153*b* are formed from a conductor such as copper, aluminum, or stainless steel.

The plasma processing apparatus 1B may further include multiple clamps 154. Both the inner antenna elements 153*a* and the outer antenna elements 153*b* are held between and supported by the clamps 154. The clamps 154 are rod-shaped. The clamps 154 extend radially from around the center of the inner antenna elements 153*a* to outside the outer antenna elements 153*b*.

The shield 160 covers the antenna 151. The shield 160 has an inner shield wall 162*a* and an outer shield wall 162*b*. The inner shield wall 162*a* is cylindrical. The inner shield wall 162*a* is between the inner antenna elements 153*a* and the outer antenna elements 153*b* to surround the inner antenna elements 153*a*. The outer shield wall 162*b* is cylindrical. The outer shield wall 162*b* is outside the outer antenna elements 153*b* to surround the outer antenna elements 153*b*.

The shield 160 further includes an inner shield plate 163*a* and an outer shield plate 163*b*. The inner shield plate 163*a* is disk-shaped and is located above the inner antenna elements 153*a* to cover an opening of the inner shield wall 162*a*. The outer shield plate 163*b* is annular and is located above the outer antenna elements 153*b* to cover an opening between the inner shield wall 162*a* and the outer shield wall 162*b*.

The shield wall and the shield plate of the shield 160 may have any shapes other than the shapes described above. The shield wall of the shield 160 may have another shape, such as a prism.

The plasma processing apparatus 1B further includes an RF power supply 170*a* and an RF power supply 170*b*. The RF power supply 170*a* and the RF power supply 170*b* serve as a plasma generator. The RF power supply 170*a* is coupled to the inner antenna elements 153*a*, and the RF power supply 170*b* is coupled to the outer antenna elements 153*b*. The RF power supply 170*a* and the RF power supply 170*b* provide RF power having the same or different frequencies to the inner antenna elements 153*a* and to the outer antenna elements 153*b*, respectively. The RF power provided from the RF power supply 170*a* to the inner antenna elements 153*a* generates a magnetic induction field in the internal space 110*s*, causing the gas in the internal space 110*s* to be excited by the magnetic induction field. This generates plasma above a middle portion of the substrate W. The RF power provided from the RF power supply 170*b* to the outer antenna elements 153*b* generates a magnetic induction field in the internal space 110*s*, causing the gas in the internal space 110*s* to be excited by the magnetic induction field. This generates annular plasma above a peripheral portion of the substrate W.

The inner antenna elements 153*a* and the outer antenna elements 153*b* may have their electrical lengths adjusted in accordance with the RF power output from the respective RF power supplies 170*a* and 170*b*. The inner shield plate 163*a* and the outer shield plate 163*b* may be adjustable by actuators 168*a* and 168*b* to be positioned differently in the height direction.

The plasma processing apparatus 1B further includes a controller MC. The controller MC in the plasma processing apparatus 1B is similar to the controller MC (as well as the various embodiments, as described) in the plasma processing apparatus 1. The controller MC controls the components of the plasma processing apparatus 1B to allow at least a step or all the steps included in the method MT to be performed by the plasma processing apparatus 1B.

The controller MC may perform step STb. When step STb is performed in the plasma processing apparatus 1B, the controller MC controls the gas supply unit GSB to supply the first process gas into the chamber 110. The controller MC also controls the exhaust device 150 to maintain the chamber 110 at a specified gas pressure. The controller MC also controls the plasma generator to generate plasma from the first process gas in the chamber 110. More specifically, the controller MC controls the RF power supply 170*a* and the RF power supply 170*b* to provide RF power. The controller MC may also control the bias power supply 164 to apply an electrical bias EB.

The controller MC may further perform step STc. When step STc is performed in the plasma processing apparatus 1B, the controller MC controls the gas supply unit GSB to supply the etching gas into the chamber 110. The controller MC also controls the exhaust device 150 to maintain the chamber 110 at a specified gas pressure. The controller MC also controls the plasma generator to generate plasma from the etching gas in the chamber 110. More specifically, the controller MC controls the RF power supply 170*a* and the RF power supply 170*b* to provide RF power. The controller MC may also control the bias power supply 164 to apply an electrical bias EB.

The controller MC may further perform step STd. When step STd is performed in the plasma processing apparatus 1B, the controller MC controls the gas supply unit GSB to supply the ashing gas into the chamber 110. The controller MC also controls the exhaust device 150 to maintain the chamber 110 at a specified gas pressure. The controller MC also controls the plasma generator to generate plasma from the ashing gas in the chamber 110. More specifically, the controller MC controls the RF power supply 170*a* and the RF power supply 170*b* to provide RF power. The controller MC may also control the bias power supply 164 to supply an electrical bias EB.

In the plasma processing apparatus 1B, the controller MC may further perform the multiple cycles described above sequentially. The controller MC may further repeat steps STb and STc alternately.

Figure 7:
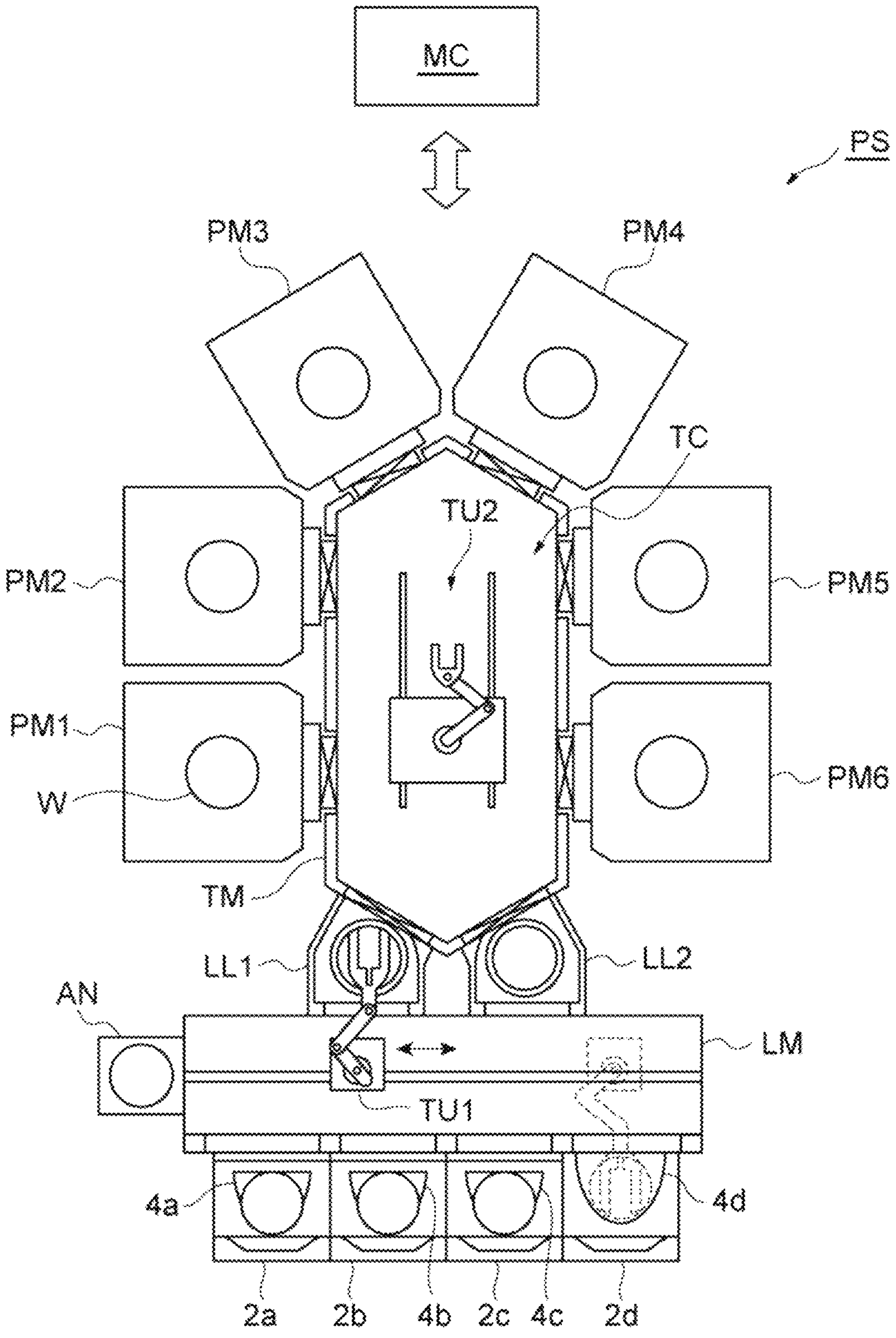
FIG. 7 is a diagram of a substrate processing system according to an exemplary embodiment.

FIG. 7 is a diagram of a substrate processing system according to an exemplary embodiment. A substrate processing system PS shown in FIG. 7 may be used with the method MT. The substrate processing system PS includes tables 2*a* to 2*d*, containers 4*a* to 4*d*, a loader module LM, an aligner AN, loadlock modules LL1 and LL2, process modules PM1 to PM6, a transfer module TM, and a controller MC. The substrate processing system PS may include one or more tables, containers, and loadlock modules. The substrate processing system PS may include one or more process modules.

The tables 2*a* to 2*d* are arranged along one edge of the loader module LM. The containers 4*a* to 4*d* are mounted on the respective tables 2*a* to 2*d*. The containers 4*a* to 4*d* each are a container called a front-opening unified pod (FOUP). The containers 4*a* to 4*d* store substrates W.

The loader module LM includes a chamber. The chamber in the loader module LM has an atmospheric pressure. The loader module LM includes a transfer unit TU1. The transfer unit TU1 may be, for example, a transfer robot controlled by the controller MC. The transfer unit TU1 transfers a substrate W through the chamber in the loader module LM. The transfer unit TU1 may transfer the substrate W between the containers 4*a* to 4*d* and the aligner AN, between the aligner AN and the loadlock modules LL1 and LL2, and between the loadlock modules LL1 and LL2 and the containers 4*a* to 4*d*. The aligner AN is connected to the loader module LM. The aligner AN adjusts the position of the substrate W (position calibration).

The loadlock modules LL1 and LL2 are located between the loader module LM and the transfer module TM. The loadlock modules LL1 and LL2 each serve as a preliminary decompression chamber.

The transfer module TM is connected to the loadlock modules LL1 and LL2 with the corresponding gate valves. The transfer module TM includes a transfer chamber TC having a decompressible (controllable atmospheric pressure that can be controllably lowered to below atmospheric pressure) internal space. The transfer module TM includes a transfer unit TU2. The transfer unit TU2 is, for example, a transfer robot controlled by the controller MC. The transfer unit TU2 transfers the substrate W through the transfer chamber TC. The transfer unit TU2 may transfer the substrate W between the loadlock modules LL1 and LL2 and the process modules PM1 to PM6, and between any two of the process modules PM1 to PM6.

The process modules PM1 to PM6 are apparatuses dedicated to intended substrate processing. One of the process modules PM1 to PM6 is a plasma processing apparatus such as the plasma processing apparatus 1 or the plasma processing apparatus 1B, which is used in step STb. The process module in the substrate processing system PS used in step STb may also be used in step STd.

Another one of the process modules PM1 to PM6 is an etching apparatus used in step STc. The process module used in step STc may be similar to the plasma processing apparatus 1 or the plasma processing apparatus 1B. The process module in the substrate processing system PS used in step STc may also be used in step STd.

Still another one of the process modules PM1 to PM6 may be an ashing apparatus used in step STd. The process module used in step STd may be similar to the plasma processing apparatus 1 or the plasma processing apparatus 1B.

The controller MC controls the components of the substrate processing system PS. The controller MC may be a computer including a processor, a storage, an input device, and a display. The controller MC executes a control program stored in the storage to control the components of the substrate processing system PS in accordance with recipe data stored in the storage. The method MT is performed using the substrate processing system PS in which the controller MC controls the components of the substrate processing system PS.

When the method MT is performed using the substrate processing system PS, the controller MC controls the process module for step STb, or the plasma processing apparatus or a deposition apparatus, to cause the chemical species contained in the plasma to be fed to the substrate W to form the deposit DP selectively or preferentially on the first region R1.

When step STb and step STc are performed in different process modules, the controller MC controls the transfer module TM to transfer the substrate W through the transfer chamber TC from the process module for step STb to the process module for step STc. The substrate W is thus transported from the chamber (the first chamber) in the process module for step STb to the chamber (the second chamber) in the process module for step STc through a vacuum alone. In other words, the substrate W is transferred from the first chamber to the second chamber through a vacuum between steps STb and STc. When steps STb and STc are performed in the same process module, the substrate W remains in the chamber in the process module.

The controller MC then controls the process module for step STc, or the etching apparatus, to etch the second region R2.

When steps STc and STd are performed in different process modules, the controller MC controls the transfer module TM to transfer the substrate W through the transfer chamber TC from the chamber in the process module for step STc to the chamber in the process module for step STd. The substrate W is thus transferred from the chamber in the process module for step STc to the chamber in the process module for step STd through a vacuum alone. In other words, the substrate W is transferred from the chamber for step STc to the chamber for step STd through a vacuum between steps STc and STd. When step STc and step STd are performed in the same process module, the substrate W remains in the process module.

The controller MC then controls the process module for step STd, or the ashing apparatus to remove the deposit DP.

Various experiments conducted for evaluating the method MT will now be described. The experiments described below are not intended to limit the present disclosure.

First Experiment and First Comparative Experiment

In a first experiment and a first comparative experiment, sample substrates SW were prepared. Each sample substrate SW includes a first region R1 and a second region R2 defining a recess RC (refer to FIGS. 8B and 8D). The first region R1 is formed from silicon nitride, and the second region R2 is formed from silicon oxide. In the sample substrate SW in the first experiment, the recess RC has a width of 12 nm and a depth of 13 nm. In the sample substrate SW in the first comparative experiment, the recess RC has a width of 12 nm and a depth of 25 nm. In the first experiment, a deposit DP was formed on the sample substrate SW using a mixture of a CO gas and an Ar gas as a first process gas in the plasma processing apparatus 1. In the first comparative experiment, a deposit DP was formed on the sample substrate SW using a mixture of a $CH_3F$ gas and an Ar gas in the plasma processing apparatus 1. The deposits DP were formed in the first experiment and the first comparative experiment under the conditions provided below.

Figure 8A:
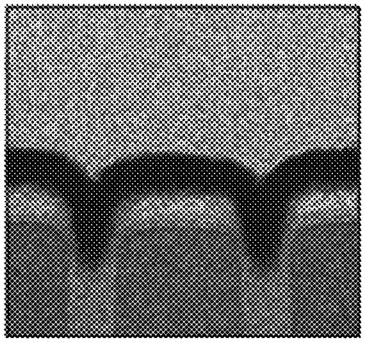
FIGS. 8A and 8B are diagrams showing the results of a first experiment.
Figure 8B:
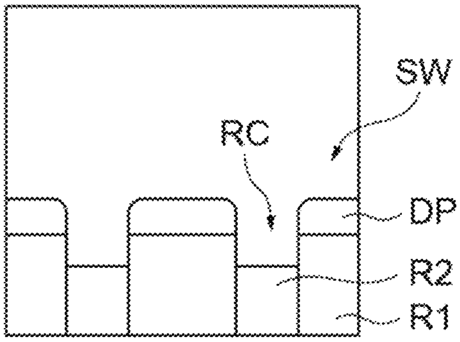
Figure 8C:
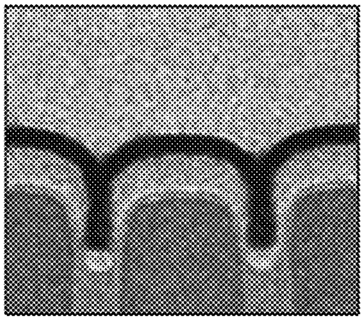
FIGS. 8C and 8D are diagrams showing the results of a first comparative experiment.
Figure 8D:
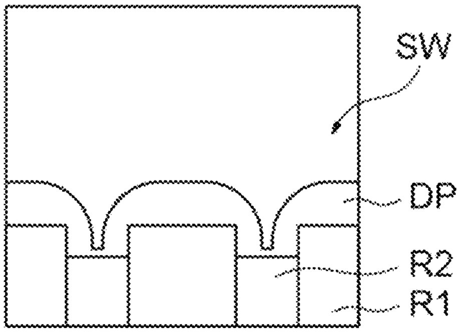

Conditions for forming deposits DP in first experiment and first comparative experiment RF power HF: 800 W RF power LF in the first experiment: 0 W RF power LF in the first comparative experiment: 0 W Processing duration in the first experiment: 120 s Processing duration in the comparative experiment: 30 s FIGS. 8A and 8B show the results of the first experiment. FIG. 8A is a transmission electron microscopy (TEM) image of the sample substrate SW on which the deposit DP is formed in the first experiment. FIG. 8B illustrates the sample substrate SW in the TEM image in FIG. 8A. FIGS. 8C and 8D show the results of the first comparative experiment. FIG. 8C is a TEM image of the sample substrate SW on which the deposit DP is formed in the first comparative experiment. FIG. 8D illustrates the sample substrate SW in the TEM image in FIG. 8C. In the first comparative experiment using a $CH_3F$ gas, the deposit DP was formed on both the first and second regions R1 and R2, and the recess RC has a narrower opening as shown in FIGS. 8C and 8D. In contrast, in the first experiment using a CO gas, the deposit DP is formed selectively or preferentially on the first region R1, and the opening of the recess RC is less narrow as shown in FIGS. 8A and 8B.

Second Experiment and Second Comparative Experiment

In a second experiment and a second comparative experiment, sample substrates SW were prepared. Each prepared sample substrate SW includes a first region R1 and a second region R2 defining a recess RC. The first region R1 is formed from silicon nitride, and the second region R2 is formed from silicon oxide. The prepared sample substrates each have a recess RC having a lower aspect ratio than the recesses RC in the sample substrates used in the first experiment and the first comparative experiment. More specifically, the sample substrate SW in the second experiment has the recess RC having a width of 12 nm and a depth of 7 nm with its aspect ratio of about 0.6. The sample substrate SW in the second comparative experiment has the recess RC having a width of 12 nm and a depth of 9 nm with its aspect ratio of about 0.8. In the second experiment, a deposit DP was formed on the sample substrate SW under the same conditions as in the first experiment. In the second comparative experiment, a deposit DP was formed on the sample substrate SW under the same conditions as in the first comparative experiment.

Figure 9A:
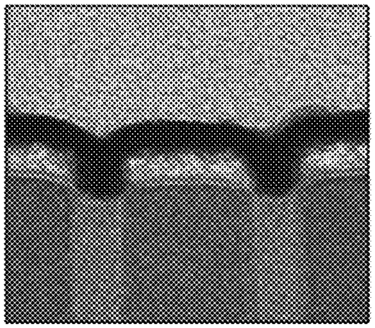
FIGS. 9A and 9B are diagrams showing the results of a second experiment.
Figure 9B:
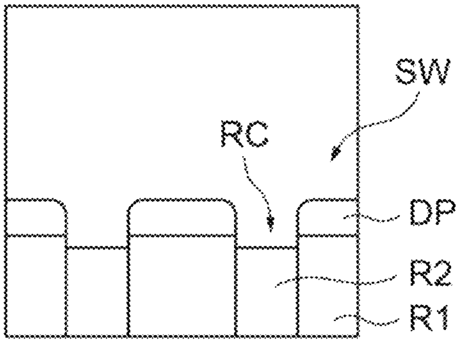
Figure 9C:
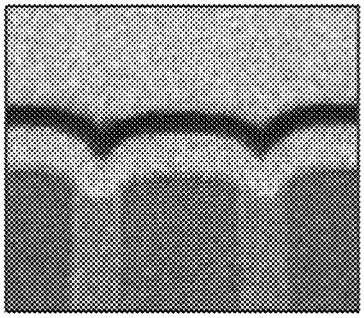
FIGS. 9C and 9D are diagrams showing the results of a second comparative experiment.
Figure 9D:
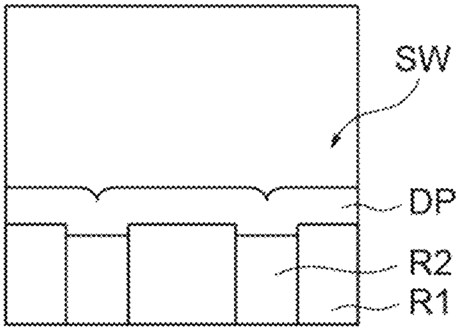

FIGS. 9A and 9B show the results of the second experiment. FIG. 9A is a TEM image of the sample substrate SW on which the deposit DP is formed in the second experiment. FIG. 9B illustrates the sample substrate SW in the TEM image in FIG. 9A. FIGS. 9C and 9D show the results of the second comparative experiment. FIG. 9C is a TEM image of the sample substrate SW on which the deposit DP is formed in the second comparative experiment. FIG. 9D illustrates the sample substrate SW in the TEM image in FIG. 9C. In the second comparative experiment using a $CH_3F$ gas, the deposit DP is formed on both the first region R1 and the second region R2, and the recess RC has a narrower opening as shown in FIGS. 9C and 9D. In contrast, in the second experiment using a CO gas, the deposit DP is formed selectively on the first region R1, and the opening of the recess RC is less narrow as shown in FIGS. 9A and 9B. The results of the second experiment reveal that the CO gas allows the deposit DP to be formed selectively on the first region R1 defining the recess RC, although the recess RC has a lower aspect ratio.

Third Experiment

Figure 10:
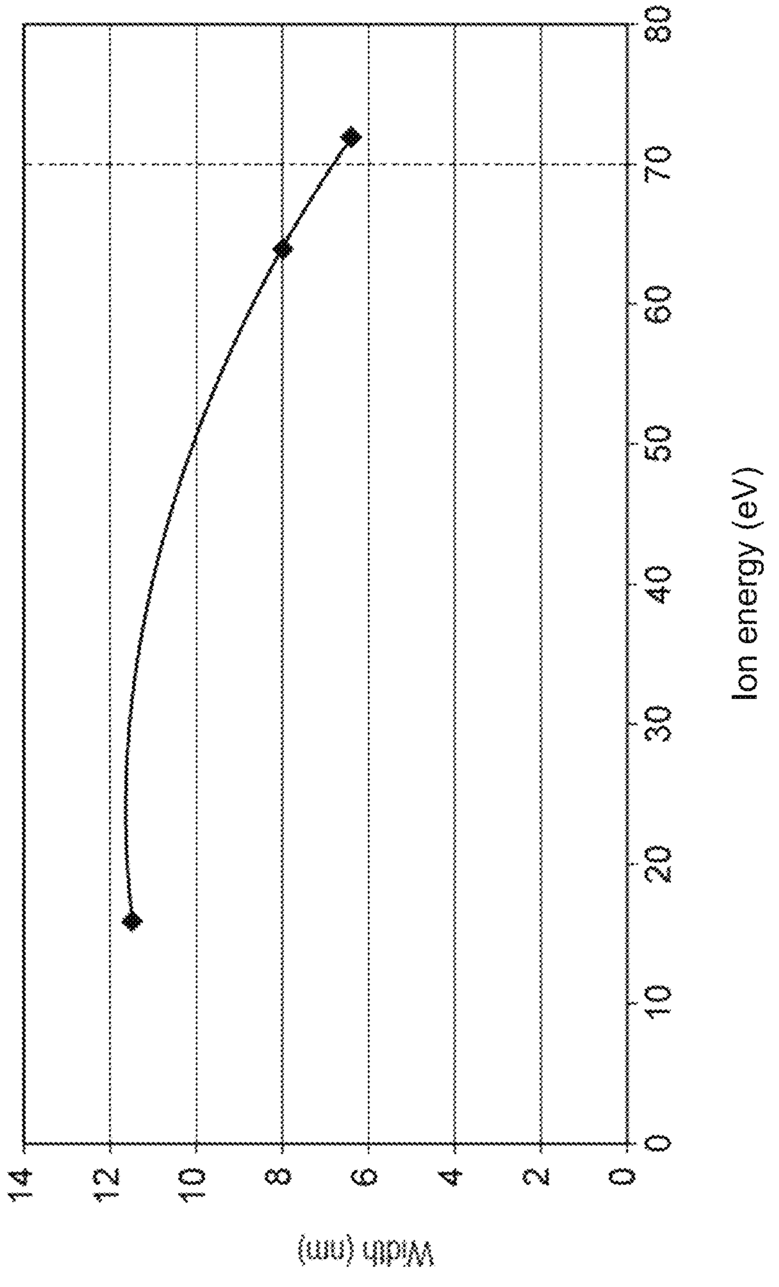
FIG. 10 is a graph showing the relationship between ion energy and the width of an opening of a recess obtained in a third experiment.

In a third experiment, multiple sample substrates SW with the same structure as the sample substrate used in the first experiment were prepared. In the third experiment, deposits DP were formed on the sample substrates SW using a mixture of a CO gas and an Ar gas as a first process gas in the plasma processing apparatus 1. In the third experiment, the deposits DP were formed on the sample substrates SW using ions with different amounts of energy (in other words, ion energy) for different sample substrates SW. In the third experiment, the ion energy was adjusted by changing the power level of the RF power LF. The other conditions in the third experiment are the same as the corresponding conditions in the first experiment. In the third experiment, the widths of the opening of the recesses RC in the sample substrates SW were determined after the deposits DP were formed. The relationship between the ion energy and the width of the opening was then obtained. The results are shown in the graph in FIG. 10. In the graph in FIG. 10, the horizontal axis indicates the ion energy and the vertical axis indicates the width of the opening. As shown in FIG. 10, the width of the opening of the recess RC is far less narrow when ions with an energy value of 70 eV or less are applied to the substrate W during formation of the deposit DP.

Fourth to Sixth Experiments

In fourth to sixth experiments, sample substrates with the same structure as the sample substrate used in the first experiment were prepared. Deposits DP were formed on the sample substrates and then the second regions R2 were etched using the plasma processing apparatus 1. In the fourth experiment, a mixture of a CO gas and an Ar gas was used as the first process gas to form the deposit DP. In the fifth experiment, a mixture of a CO gas and a $CH_4$ gas was used as the first process gas to form the deposit DP. In the sixth experiment, a mixture of a CO gas and an $H_2$ gas was used as a first process gas to form the deposit DP. The other conditions for forming the deposit DP in each of the fourth to sixth experiments are the same as the conditions in the first experiment. The second regions R2 were etched in the fourth to sixth experiments under the conditions provided below.

Conditions for etching second region R2

RF power HF: 100 W

RF power LF: 100 W

Etching gas: a mixture of an $NF_3$ gas and an Ar gas

Processing duration: 6 s

Figure 11:
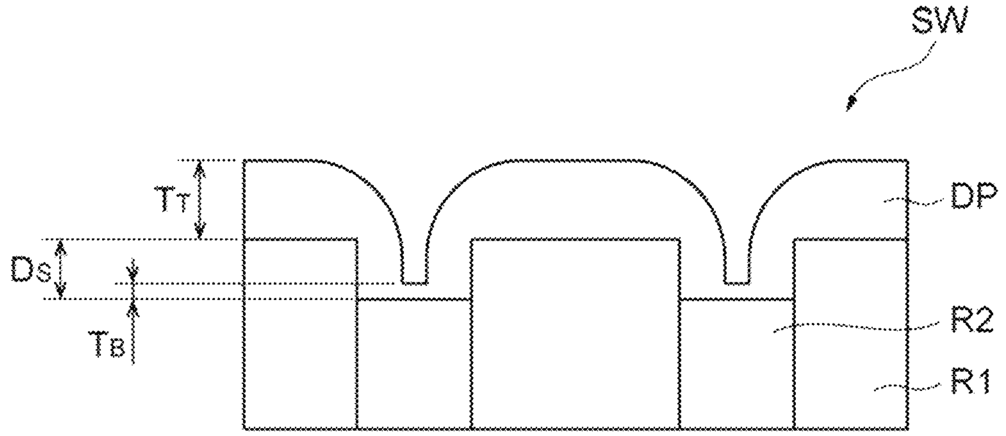
FIG. 11 is a diagram describing the dimensions measured in fourth to sixth experiments.
Figure 12A:
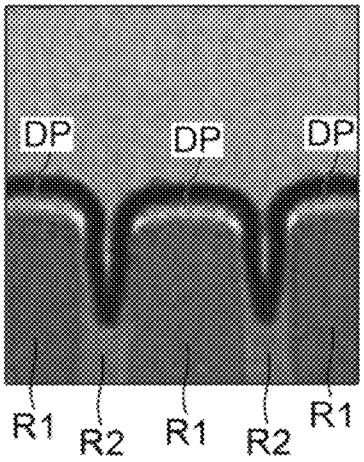
FIGS. 12A to 12F are transmission electron microscopy (TEM) images of the sample substrates on which deposits DP are formed in seventh to twelfth experiments.
Figure 12D:
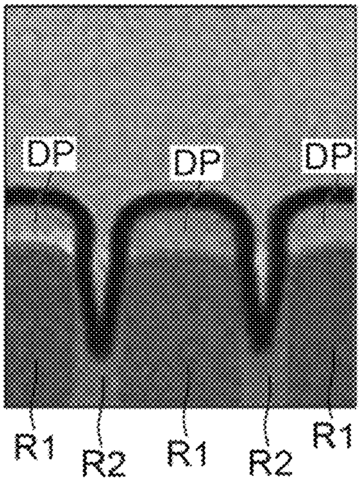
Figure 12B:
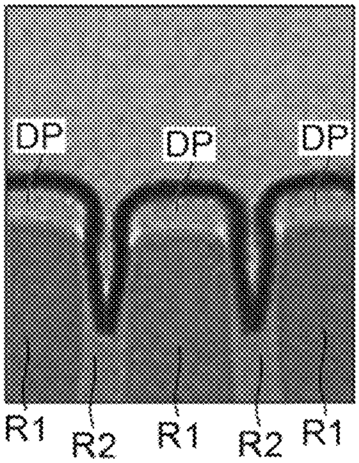
Figure 12E:
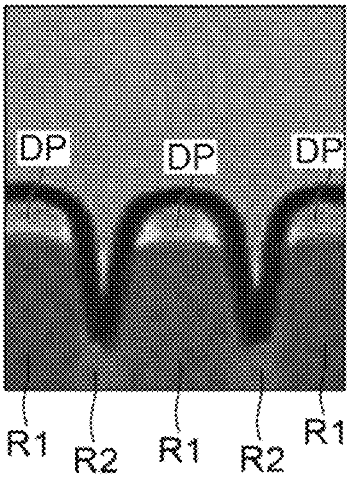
Figure 12C:
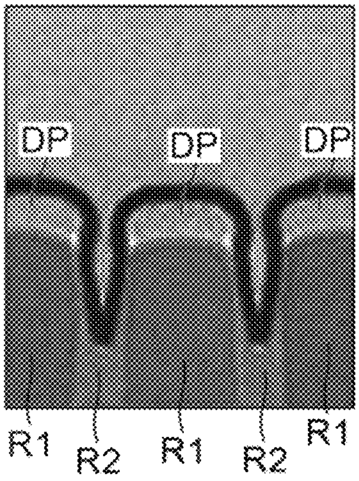
Figure 12F:
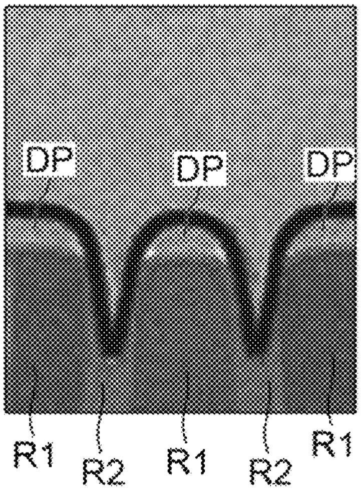

FIG. 11 is a diagram describing the dimensions measured in the fourth to sixth experiments. In each of the fourth to sixth experiments, a film thickness $T_B$ of the deposit DP before etching of the second region R2, an increase in a measured depth Ds of the recess resulting from etching of the second region R2, and a decrease in a measured film thickness $T_T$ of the deposit DP resulting from etching of the second region R2 were determined. The film thickness $T_B$ is the film thickness of the deposit DP at the bottom of the recess. The film thickness $T_T$ is the film thickness of the deposit DP on the first region R1.

The measured film thickness $T_B$ is 1.8 nm, 3.0 nm, and 1.6 nm respectively in the fourth to sixth experiments. In other words, the deposit DP formed with the mixture of a CO gas and an Ar gas or the mixture of a CO gas and an $H_2$ gas as the first process gas has, at the bottom of the recess, a smaller film thickness than the deposit DP formed with the first process gas containing a $CH_4$ gas. The increase in the measured depths Ds of the recess is 1.0 nm, 0.5 nm, and 0.9 nm respectively in the fourth to sixth experiments. In other words, with the first process gas containing the mixture of a CO gas and an Ar gas or the mixture of a CO gas and an $H_2$ gas, the second region R2 was etched more at the bottom of the recess than with the first process gas containing a $CH_4$ gas. The decrease in the measured film thicknesses $T_T$ is 3.5 nm, 1.7 nm, and 1.2 nm respectively in the fourth to sixth experiments. In other words, with the first process gas containing the mixture of a CO gas and an $H_2$ gas for forming the deposit DP, a decrease in a measured film thickness $T_T$ is far less than with the first process gas containing another process gas. This reveals that a protective film highly resistive to etching of the second region R2 can be formed selectively or preferentially on the first region R1 using the mixture of a CO gas and an $H_2$ gas as the first process gas.

Seventh to Twelfth Experiments

In seventh to twelfth experiments, sample substrates with the same structure as the sample substrate used in the first experiment were prepared. Deposits DP were formed on the sample substrates using the plasma processing apparatus 1. In the seventh to twelfth experiments, a process gas used for forming the deposit DP contains a CO gas and an Ar gas. In the eighth to twelfth experiments, a first process gas used for forming the deposit DP further contains an $H_2$ gas. The ratio of the flow rate of the $H_2$ gas to the total flow rate of the CO gas and the $H_2$ gas contained in the first process gas is 0, 1/19, 4/49, 2/17, 1/4, and 5/14 respectively in the seventh to twelfth experiments. The other conditions for forming the deposit DP in each of the seventh to twelfth experiments are the same as the conditions in the first experiment.

FIG. 12A, FIG. 12B, FIG. 12C, FIG. 12D, FIGS. 12E, and 12F are TEM images of the sample substrates on which the deposits DP are formed in the seventh to twelfth experiments. The deposit DP formed on the first region R1 in the respective eighth to tenth experiments (refer to FIGS. 12B to 12D) has a side surface with higher verticality than the deposit DP formed on the first region R1 in the other experiments (refer to FIGS. 12E and 12F). This reveals that the deposit DP formed on the first region R1 has a side surface with higher verticality when the ratio of the flow rate of the $H_2$ gas to the total flow rate of the CO gas and the $H_2$ gas contained in the first process gas is 1/19 to 2/17 inclusive.

Figure 13:
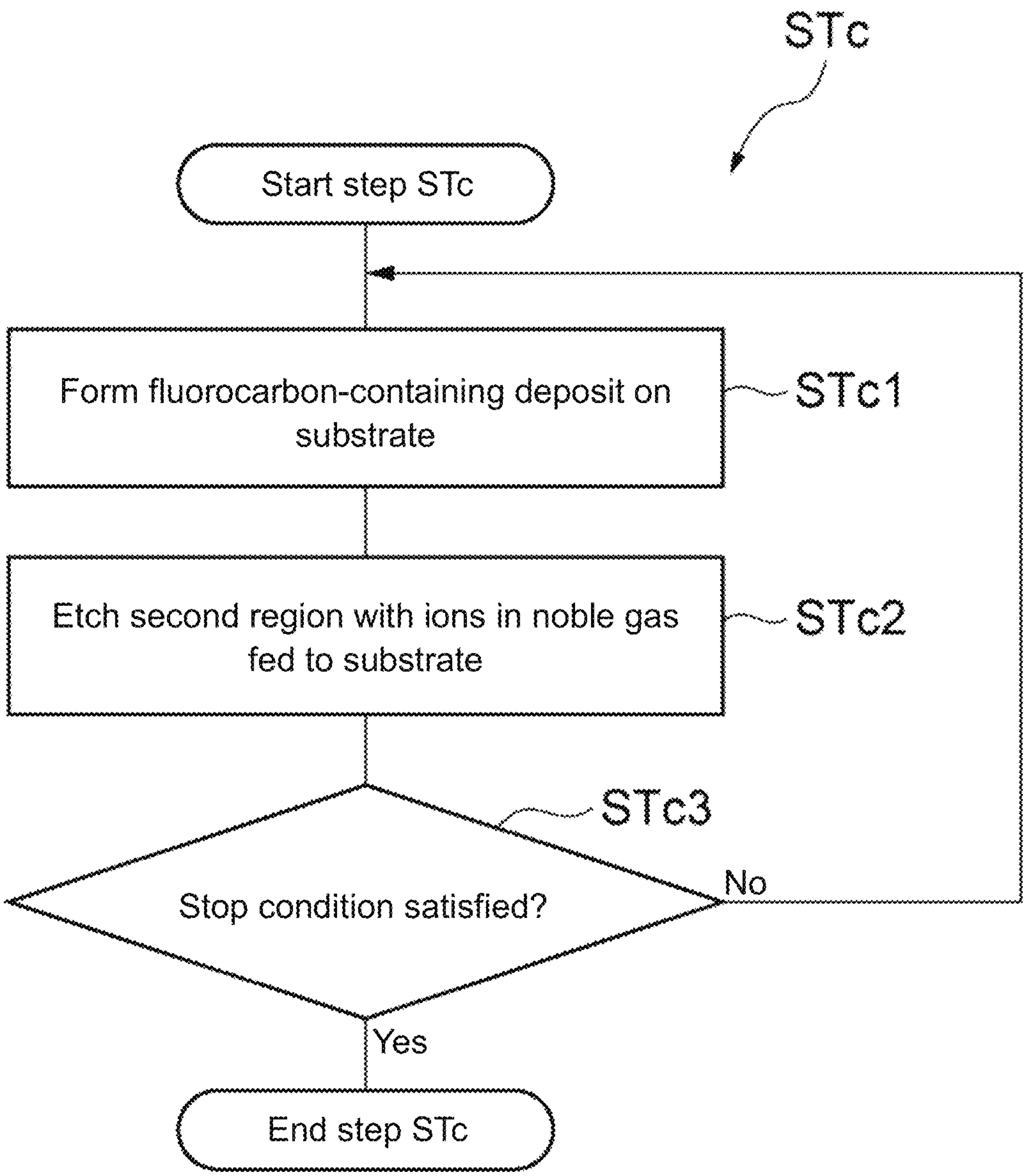
FIG. 13 is a flowchart of step STc in an exemplary embodiment that may be included in the etching method shown in FIG. 1.

FIG. 13, FIG. 14A, FIG. 14B, FIG. 14C, FIG. 14D, and FIG. 14E will now be referred to in addition to FIG. 1. FIG. 13 is a flowchart of step STc in an exemplary embodiment that may be included in the etching method shown in FIG. 1. FIGS. 14A to 14E are partially enlarged cross-sectional views of the example substrate processed through the respective steps included in the etching method shown in FIG. 1. The method MT including step STc shown in FIG. 13 will now be described with reference to FIG. 2 showing an example substrate W to be processed with the step.

Figures 14A, 14B, 14C, 14D, 14E:
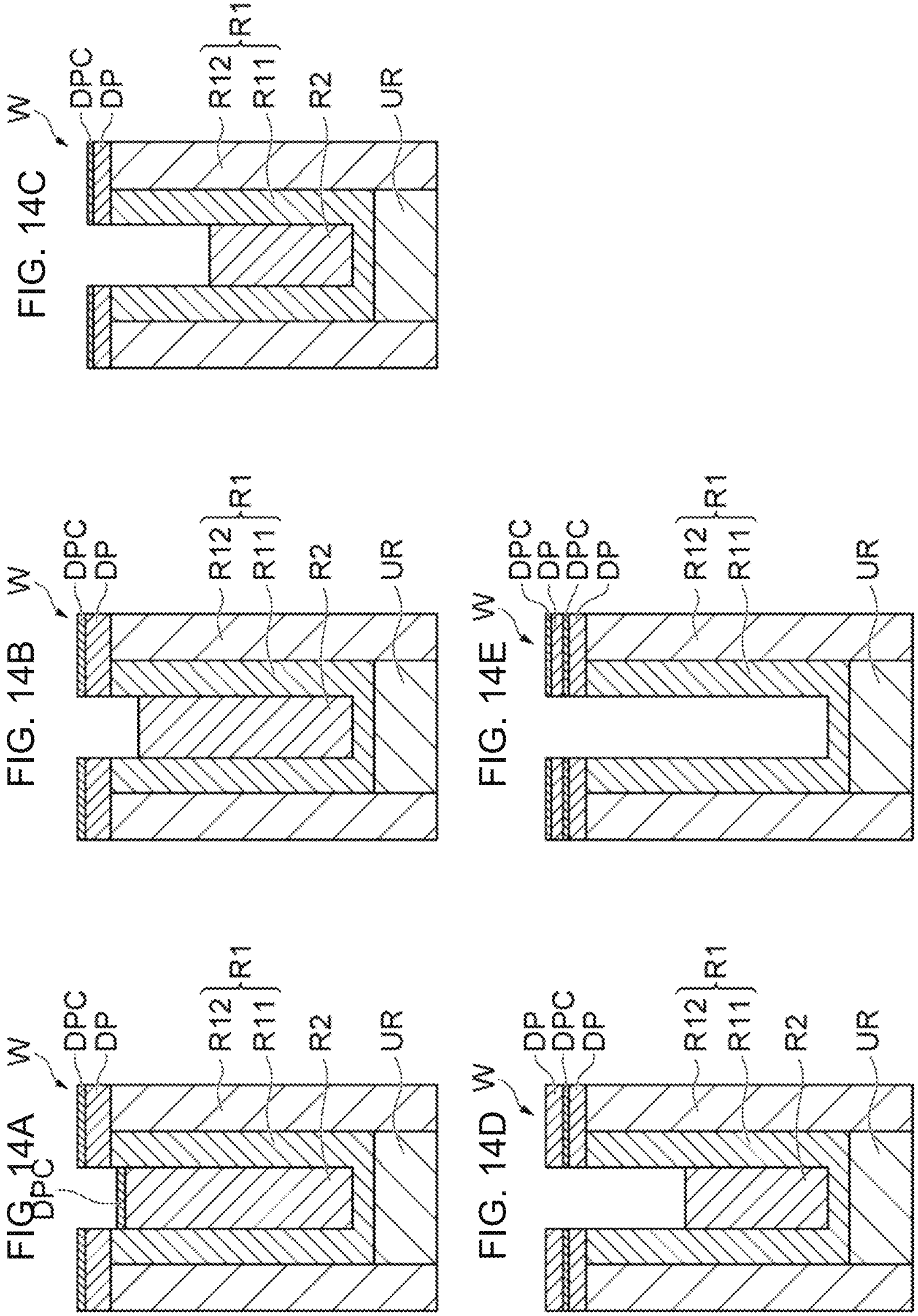
FIGS. 14A to 14E are partially enlarged cross-sectional views of the example substrate processed through the respective steps included in the etching method shown in FIG. 1.

Step STc shown in FIG. 13 includes steps STc1 and STc2. In step STc1, a deposit DPC is formed on the substrate W as shown in FIG. 14A. The deposit DPC contains a fluorocarbon. In step STc1, plasma is generated from a second process gas in the chamber in the etching apparatus to form the deposit DPC on the substrate W. The second process gas used in step STc1 contains a fluorocarbon gas such as a $C_4F_6$ gas. The fluorocarbon gas contained in the second process gas used in step STc1 may be a fluorocarbon gas other than a $C_4F_6$ gas. In step STc1, a fluorocarbon is fed to the substrate W from plasma generated from the second process gas to form the deposit DPC on the substrate W.

In step STc2, ions contained in a noble gas are fed to the substrate W to etch the second region R2. In step STc2, plasma is generated from the noble gas in the chamber in the etching apparatus. The noble gas used in step STc2 is, for example, an Ar gas. The noble gas used in step STc2 may be a noble gas other than an Ar gas. In step STc2, ions in the noble gas contained in the plasma are fed to the substrate W. The ions in the noble gas fed to the substrate W cause the fluorocarbon contained in the deposit DPC to react with the material for the second region R2. In step STc2, the second region R2 is thus etched as shown in FIG. 14B. Step STc2 continues until the deposit DPC on the second region R2 is substantially consumed. In contrast, with the deposit DPC formed on the deposit DP, the deposit DPC above the first region R1 is not removed upon receiving the ions in the noble gas.

In step STc shown in FIG. 13, steps STc1 and STc2 may be repeated alternately to further etch the second region R2, as shown in FIG. 14C. In this case, step STc includes step STc3. In step STc3, the determination is performed as to whether a stop condition is satisfied. In step STc3, the stop condition is satisfied when the count of cycles including alternating steps STc1 and STc2 reaches a predetermined number. When the stop condition is not satisfied in step STc3, steps STc1 and STc2 are restarted sequentially. When the stop condition is satisfied in step STc3, step STc ends.

Step STc may be followed by step STd. In some embodiments, step STc may be followed by step STJ, without step STd. In step STJ, the determination may be performed as to whether a stop condition is satisfied. When the stop condition is not satisfied in step STJ, step STb is restarted. In step STb, the deposit DP is formed on the deposit DPC on the first region R1 as shown in FIG. 14D. Step STc shown in FIG. 13 is then restarted to further etch the second region R2 as shown in FIG. 14E.

In step STc shown in FIG. 13, the deposit DPC formed on the second region R2 is used to etch the second region R2 and is substantially consumed in step STc2. When step STc is followed by step STb, the second region R2 is exposed. The deposit DP is thus formed selectively or preferentially on the deposit DPC on the first region R1 without being formed on the second region R2. The second region R2 is thus etched without the etching being stopped in step STc following step STb. Step STb is performed while the deposit DPC remains on the first region R1. The deposit DP is thus sufficiently formed on the corner of the first region R1 of the substrate W shown in FIG. 2. With the method MT including step STc shown in FIG. 13, the first region R1 is protected more reliably.

The etching apparatus used in step STc shown in FIG. 13 may be the plasma processing apparatus 1 or the plasma processing apparatus 1B. When any of the plasma processing apparatuses 1 and 1B is used, the controller MC performs step STc by performing multiple etching cycles each including steps STc1 and STc2. When the etching apparatus used in step STc shown in FIG. 13 is the plasma processing apparatus 1, the controller MC in the plasma processing apparatus 1 controls the gas supply unit GS to supply the second process gas into the chamber 10 in step STc1. In step STc1, the controller MC controls the exhaust device 50 to maintain the chamber 10 at a specified gas pressure. In step STc1, the controller MC also controls the plasma generator to generate plasma from the second process gas in the chamber 10. More specifically, the controller MC controls the RF power supply 62 to provide RF power HF. In step STc1, the controller MC may also control the bias power supply 64 to apply an electrical bias EB. In some embodiments, the electrical bias EB may not be applied in step STc1.

In step STc2, the controller MC in the plasma processing apparatus 1 controls the gas supply unit GS to supply a noble gas into the chamber 10. In step STc2, the controller MC controls the exhaust device 50 to maintain the chamber 10 at a specified gas pressure. In step STc2, the controller MC also controls the plasma generator to generate plasma from the noble gas in the chamber 10. More specifically, the controller MC controls the RF power supply 62 to provide RF power HF. In step STc2, the controller MC also controls the bias power supply 64 to apply an electrical bias EB.

When the etching apparatus used in step STc shown in FIG. 13 is the plasma processing apparatus 1B, the controller MC in the plasma processing apparatus 1B controls the gas supply unit GSB to supply the second process gas containing a fluorocarbon gas into the chamber 110. In step STc1, the controller MC controls the exhaust device 150 to maintain the chamber 110 at a specified gas pressure. In step STc1, the controller MC also controls the plasma generator to generate plasma from the second process gas in the chamber 110. More specifically, the controller MC controls the RF power supply 170*a* and the RF power supply 170*b* to provide RF power. In step STc1, the controller MC may also control the bias power supply 164 to apply an electrical bias EB.

In step STc2, the controller MC in the plasma processing apparatus 1B controls the gas supply unit GSB to supply a noble gas into the chamber 110. In step STc2, the controller MC controls the exhaust device 150 to maintain the chamber 110 at a specified gas pressure. In step STc2, the controller MC also controls the plasma generator to generate plasma from the noble gas in the chamber 110. More specifically, the controller MC controls the RF power supply 170*a* and the RF power supply 170*b* to provide RF power. In step STc2, the controller MC also controls the bias power supply 164 to apply an electrical bias EB.

Figure 15:
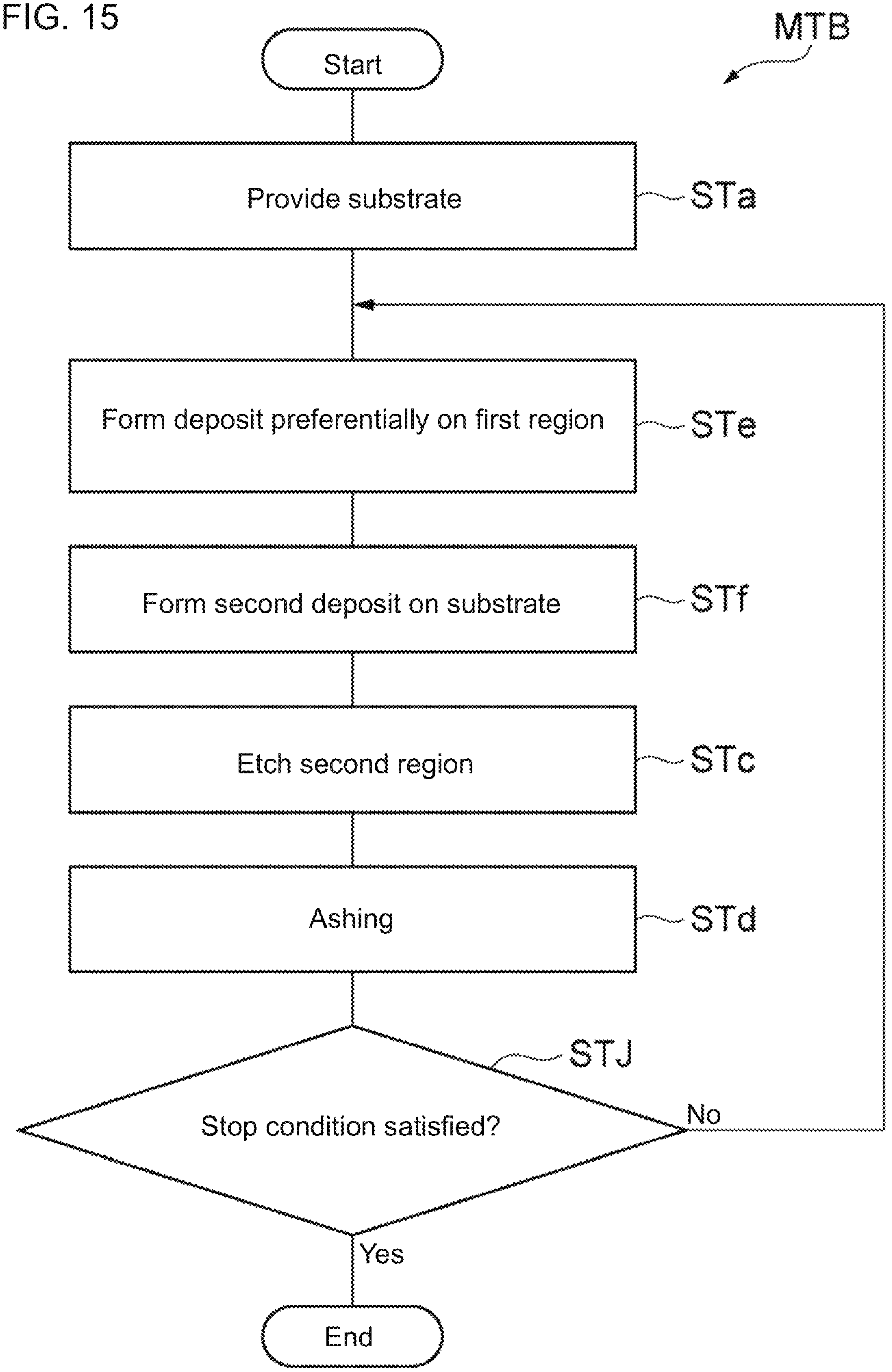
FIG. 15 is a flowchart of an etching method according to another exemplary embodiment.

An etching method according to another exemplary embodiment will now be described with reference to FIG. 15. FIG. 15 is a flowchart of the etching method according to another exemplary embodiment. The etching method shown in FIG. 15 (hereinafter referred to as a method MTB) includes steps STa, STe, and STc. With the method MTB, multiple cycles each including steps STe and STc may be performed sequentially. The method MTB may further include step STf. Each of the multiple cycles may further include step STf. The method MTB may further include step STd. Each of the multiple cycles may further include step STd.

Figure 16:
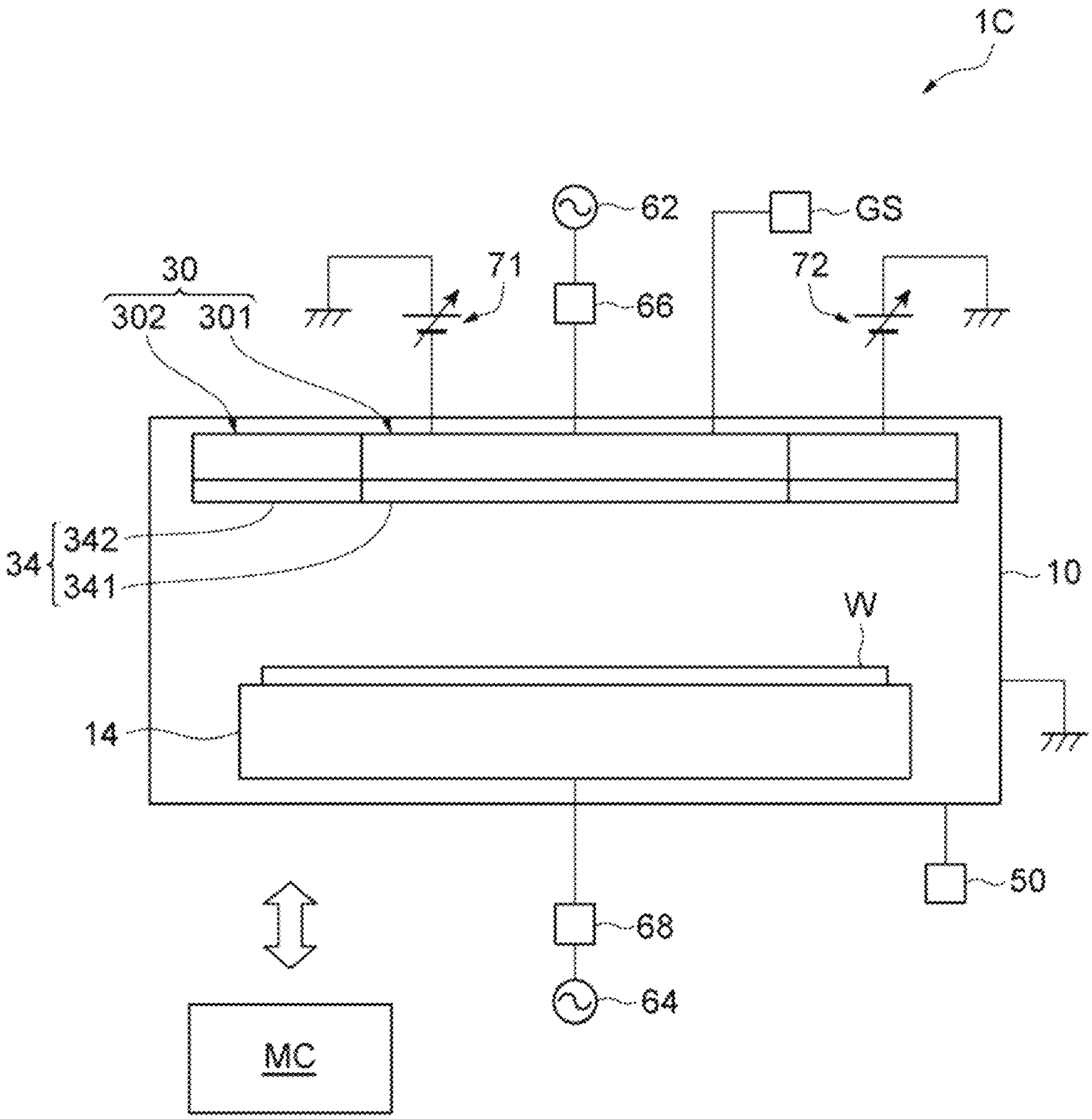
FIG. 16 is a schematic diagram of a plasma processing apparatus according to another exemplary embodiment.

The method MTB may be implemented with the plasma processing apparatus 1 or the plasma processing apparatus 1B. The method MTB may be implemented with a different plasma processing apparatus. FIG. 16 is a schematic diagram of a plasma processing apparatus according to another exemplary embodiment. A plasma processing apparatus 1C shown in FIG. 16 will now be described focusing on its differences from the plasma processing apparatus 1.

The plasma processing apparatus 1C includes at least one DC power supply. The DC power supply applies a negative DC voltage to the upper electrode 30. When a negative DC voltage is applied to the upper electrode 30 while plasma is being generated in the chamber 10, positive ions in the plasma strike the ceiling plate 34. Secondary electrons are then emitted from the ceiling plate 34 and fed to the substrate. Silicon is also released from the ceiling plate 34 and fed to the substrate.

In one embodiment, the upper electrode 30 may include an inner portion 301 and an outer portion 302. The inner portions 301 and the outer portion 302 are electrically isolated from each other. The outer portion 302 is located radially outside the inner portion 301 and extends circumferentially to surround the inner portion 301. The inner portion 301 includes an inner region 341 of the ceiling plate 34, and the outer portion 302 includes an outer region 342 of the ceiling plate 34. The inner region 341 may be substantially disk-shaped, and the outer region 342 may be annular. Each of the inner and outer regions 341 and 342 is formed from a silicon-containing material similarly to the ceiling plate 34 in the plasma processing apparatus 1.

In the plasma processing apparatus 1C, an RF power supply 62 supplies RF power HF to both the inner portions 301 and the outer portion 302. The plasma processing apparatus 1 may include a DC power supply 71 and a DC power supply 72 as the at least one DC power supply. Each of the DC power supplies 71 and 72 may be a variable DC power supply. The DC power supply 71 is electrically coupled to the inner portion 301 to apply a negative DC voltage to the inner portion 301. The DC power supply 72 is electrically coupled to the outer portion 302 to apply a negative DC voltage to the outer portion 302. The other structures of the plasma processing apparatus 1C may be the same as the corresponding structures of the plasma processing apparatus 1.

Referring back to FIG. 15, the method MTB will be described with reference to FIG. 2 showing an example substrate W to be processed with the method. FIGS. 17A to 17D are a partially enlarged cross-sectional views of the example substrate processed through the respective steps included in the etching method shown in FIG. 15.

The method MTB starts from step STa. Step STa in the method MTB is the same as step STa in the method MT.

Figure 17A:
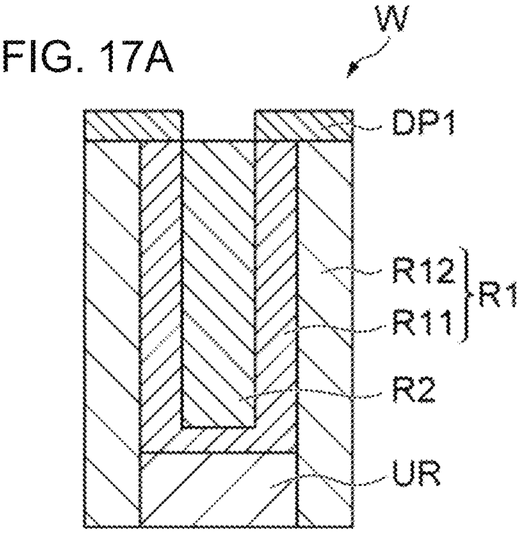
FIGS. 17A to 17D are partially enlarged cross-sectional views of the example substrate processed through the respective steps included in the etching method shown in FIG. 15.

Step STe follows step STa. In step STe, a first deposit DP1 is formed selectively or preferentially on the first region R1 as shown in FIG. 17A.

In one embodiment, step STe may be the same as step STb. In this case, the first deposit DP1 formed in step STe is the same as the deposit DP. In this case, the plasma processing apparatus used in step STe may be the plasma processing apparatus 1, 1B, or 1C.

In another embodiment, step STe may include applying a negative DC voltage to the upper electrode 30 while the same processing as in step STb is being performed. In this case, the plasma processing apparatus 1C is used in step STe. In this case, the first deposit DP1 is a dense film formed from a chemical species (e.g., carbon) contained in plasma generated from the first process gas and silicon released from the ceiling plate 34. In this case, the controller MC in the plasma processing apparatus 1C further performs applying a negative DC voltage to the upper electrode 30 while step STb is being performed.

In step STe, the controller MC controls the at least one DC power supply to apply a negative DC voltage to the upper electrode 30. More specifically, the controller MC controls the DC power supplies 71 and 72 to apply a negative DC voltage to the upper electrode 30. The negative DC voltage applied from the DC power supply 71 to the inner portion 301 of the upper electrode 30 may have a greater absolute value than the negative DC voltage applied from the DC power supply 72 to the outer portion 302 of the upper electrode 30. In step STe, the DC power supply 72 may not apply a voltage to the outer portion 302 of the upper electrode 30.

Figure 17B:
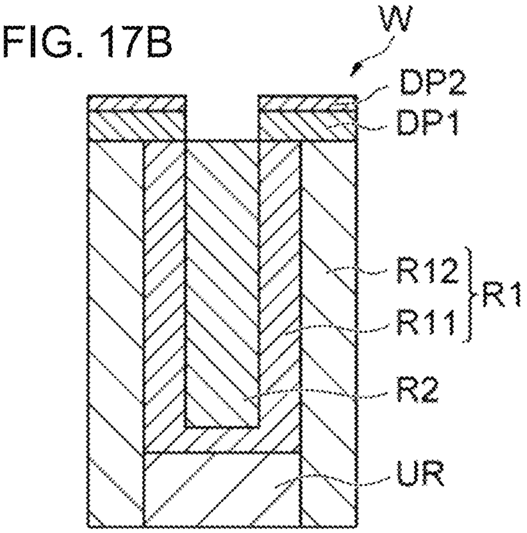

As described above, the method MTB may further include step STf. Step STf is performed after step STe and before step STc. In step STf, a second deposit DP2 is formed on the substrate W as shown in FIG. 17B. The second deposit DP2 contains silicon. The controller MC in the plasma processing apparatus used in step STf performs step STf.

In step STf, the second deposit DP2 may be formed by plasma-enhanced chemical vapor deposition (PECVD). When the second deposit DP2 is formed by PECVD, the plasma processing apparatus used in step STf may be the plasma processing apparatus 1, 1B, or 1C.

When PECVD is performed using the plasma processing apparatus 1 or 1C in step STf, the controller MC controls the gas supply unit GS to supply the process gas into the chamber 10. The process gas contains a silicon-containing gas such as an $SiCl_4$ gas. The process gas may further contain an $H_2$ gas. The controller MC also controls the exhaust device 50 to maintain the chamber 10 at a specified gas pressure. The controller MC also controls the plasma generator to generate plasma from the process gas in the chamber 10. More specifically, the controller MC controls the RF power supply 62 to provide RF power HF.

When PECVD is performed using the plasma processing apparatus 1B in step STf, the controller MC controls the gas supply unit GSB to supply the process gas into the chamber 110. The process gas contains a silicon-containing gas such as an $SiCl_4$ gas. The process gas may further contain an $H_2$ gas. The controller MC also controls the exhaust device 150 to maintain the chamber 110 at a specified gas pressure. The controller MC also controls the plasma generator to generate plasma from the process gas in the chamber 110. More specifically, the controller MC controls the RF power supply 170*a* and the RF power supply 170*b* to provide RF power.

In some embodiments, step STf may include applying a negative DC voltage to the upper electrode 30 while plasma is being generated in the chamber 10. When a negative DC voltage is applied to the upper electrode 30 while plasma is being generated in the chamber 10, positive ions in the plasma strike the ceiling plate 34. Secondary electrons are thus emitted from the ceiling plate 34 and fed to the substrate W. Silicon is also released from the ceiling plate 34 and fed to the substrate W. The silicon fed to the substrate W forms the second deposit DP2 on the substrate W. In this case, the plasma processing apparatus 1C is used in step STf.

The controller MC in the plasma processing apparatus 1C performs step STf. In step STf, the controller MC controls the gas supply unit GS to supply a gas into the chamber 10. The gas supplied to the chamber 10 in step STf contains a noble gas such as an Ar gas. The gas supplied to the chamber 10 in step STf may further contain a hydrogen gas (an $H_2$ gas). The controller MC also controls the exhaust device 50 to maintain the chamber 10 at a specified gas pressure. The controller MC also controls the plasma generator to generate plasma from a gas in the chamber 10. More specifically, the controller MC controls the RF power supply 62 to provide RF power HF.

In step STf, the controller MC controls the at least one DC power supply to apply a negative DC voltage to the upper electrode 30. More specifically, the controller MC controls the DC power supplies 71 and 72 to apply a negative DC voltage to the upper electrode 30. The negative DC voltage applied from the DC power supply 71 to the inner portion 301 of the upper electrode 30 may have a greater absolute value than the negative DC voltage applied from the DC power supply 72 to the outer portion 302 of the upper electrode 30.

Figure 17C:
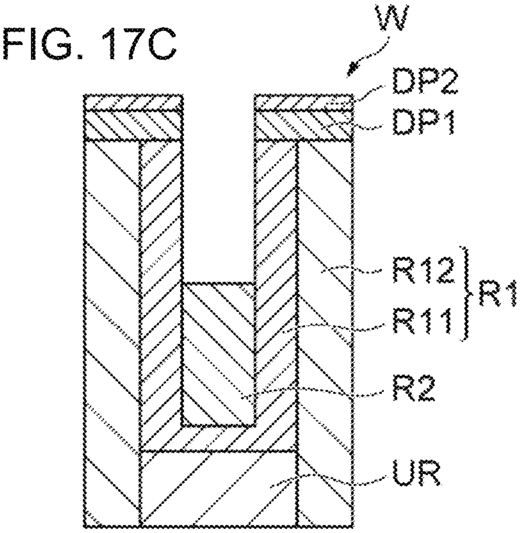

With the method MTB, step STc is then performed to etch the second region R2 as shown in FIG. 17C. Step STc in the method MTB is the same as step STc in the method MT. The plasma processing apparatus used in step STc may be the plasma processing apparatus 1, 1B, or 1C.

Figure 17D:
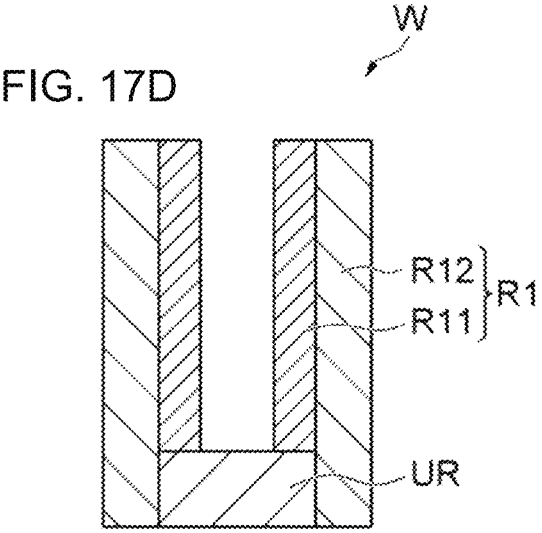

With the method MTB, after the second region R2 is etched, step STd may be performed to remove the first deposit DP1 and the second deposit DP2 as shown in FIG. 17D. Step STd in the method MTB is the same as step ST in the method MT. The plasma processing apparatus used in step STd may be the plasma processing apparatus 1, 1B, or 1C.

With the method MTB, the second deposit DP2 is formed on the first deposit DP1 to further reduce the likelihood of etching of the corner of the first region R1 of the substrate W and to reduce the likelihood of enlarging the opening of the recess defined by the first region R1.

As described above, the method MT may perform multiple cycles each including steps STe, STf, STc, and STd. In some of the multiple cycles, at least one of steps STe, STf, and STd may be eliminated. The number of cycles including step STe may be less than the number of cycles including step STf. In this case, the count of step STe can be reduced by performing step STf to form the second deposit DP2 before the first deposit DP1 is consumed.

Figure 18:
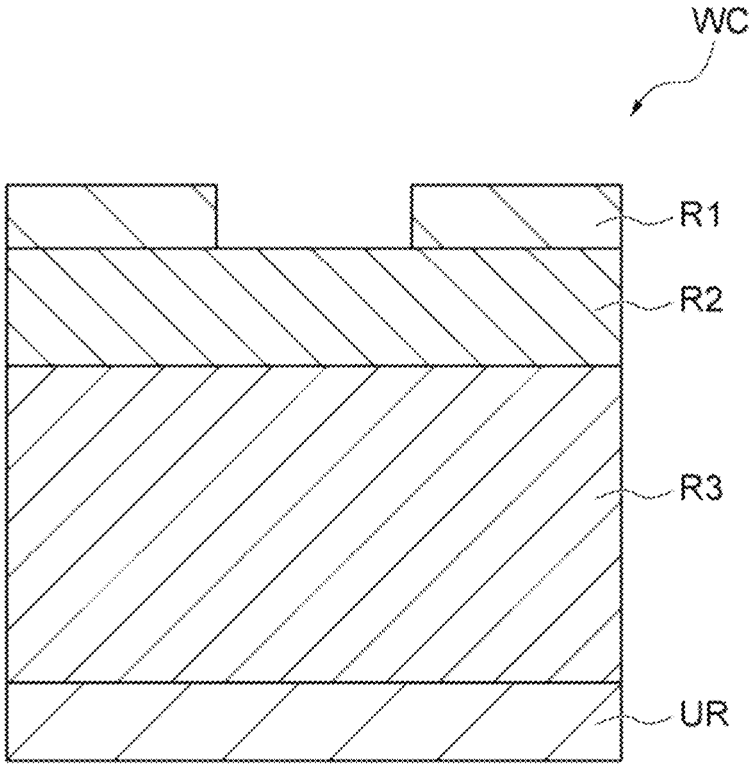
FIG. 18 is a partially enlarged cross-sectional view of still another example substrate to be processed with etching methods according to various exemplary embodiments.

FIG. 18 will now be referred to. FIG. 18 is a partially enlarged cross-sectional view of still another example substrate to be processed with etching methods according to various exemplary embodiments. The method MT may be used for the substrate WC shown in FIG. 18.

The substrate WC includes a first region R1 and a second region R2. The substrate WC may further include a third region R3 and an underlying region UR. The third region R3 is formed on the underlying region UR. The third region R3 is formed from an organic material. The second region R2 is formed on the third region R3. The second region R2 contains silicon oxide. The second region R2 may include a silicon oxide film and a silicon carbide film on the silicon oxide film. The first region R1 is a mask formed on the second region R2 and is patterned. The second region R2 may be a photoresist mask. The second region R2 may be an extreme ultraviolet (EUV) mask.

Figure 19A:
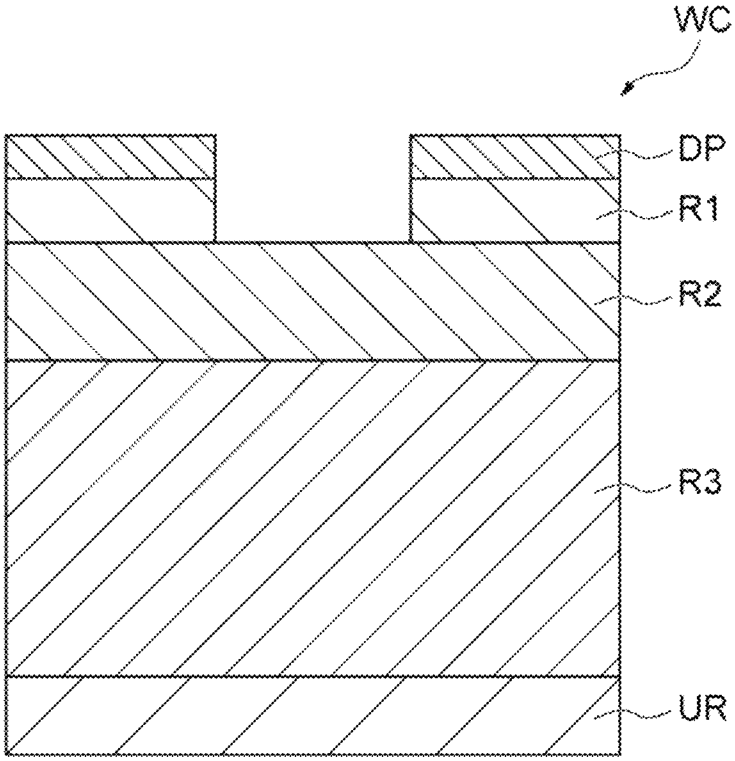
FIGS. 19A and 19B are partially enlarged cross-sectional views of the example substrate processed through the respective steps included in the etching method according to the exemplary embodiment.
Figure 19B:
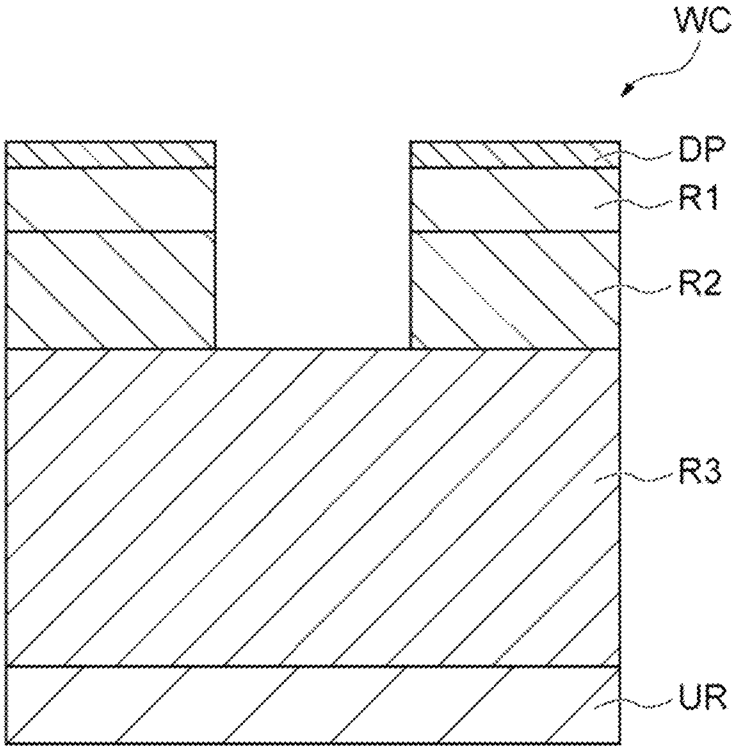

FIGS. 19A and 19B are partially enlarged cross-sectional views of the example substrate processed through the respective steps included in the etching method according to the exemplary embodiment. When the method MT is used for the substrate WC, the deposit DP is formed selectively or preferentially on the first region R1 in step STb as shown in FIG. 19A. In step STc, the second region R2 is etched as shown in FIG. 19B. The method MTB may be used for the substrate WC shown in FIG. 18.

Although the various exemplary embodiments have been described above, various additions, omissions, substitutions, and modifications may be made without limitation to the exemplary embodiments described above. The components in the different exemplary embodiments may be combined to form another exemplary embodiment.

The plasma processing apparatus used with the methods MT and MTB may be a capacitively coupled plasma processing apparatus different from the plasma processing apparatus 1. The plasma processing apparatus used with the methods MT and MTB may be an inductively coupled plasma processing apparatus different from the plasma processing apparatus 1B. The plasma processing apparatus used with the methods MT and MTB may be any type of plasma processing apparatus. Examples of such a plasma processing apparatus include an electron cyclotron resonance (ECR) plasma processing apparatus and a plasma processing apparatus that generates plasma using surface waves such as microwaves.

The exemplary embodiments according to the present disclosure have been described by way of example, and various changes may be made without departing from the scope and spirit of the present disclosure. The exemplary embodiments disclosed above are thus not restrictive, and the true scope and spirit of the present disclosure are defined by the appended claims.

REFERENCE SIGNS LIST

W Substrate
R1 First region
R2 Second region
1 Plasma processing apparatus
10 Chamber
14 Substrate support
MC Controller

The invention claimed is:

1. An etching method, comprising:

(a) providing a substrate, the substrate including a first region and a second region, the first region and the second region being exposed, the second region comprising silicon oxide, and the first region comprising silicon nitride;

(b) forming a deposit selectively on the first region and not on the second region with a first plasma generated from a first process gas containing a carbon monoxide gas or a carbonyl sulfide gas; and (c) plasma etching the second region while the first region is covered by the deposit.

2. The etching method according to claim 1, wherein (c) includes (c1) forming a different deposit containing a fluorocarbon on the substrate with plasma generated from a second process gas containing a fluorocarbon gas, and (c2) etching the second region by feeding ions in plasma generated from a noble gas to the substrate on which the different deposit is formed.

3. The etching method according to claim 2, wherein (b) and (c) are repeated alternately.

4. The etching method according to claim 2, wherein side and bottom portions of the second region are surrounded by the first region and is etched in a self-aligned manner in (c).

5. The etching method according to claim 1, wherein the first region includes a photoresist mask on the second region.

6. The etching method according to claim 1, wherein (b) and (c) are performed in a same chamber.

7. The etching method according to claim 1, wherein (b) is performed in a first chamber, and (c) is performed in a second chamber.

8. The etching method according to claim 7, further comprising:

transporting the substrate from the first chamber to the second chamber through a vacuum environment between (b) and (c).

9. The etching method according to claim 1, wherein:

the first region consists of silicon nitride, and the second region consists of silicon oxide.

10. The etching method according to claim 1, wherein (c) is performed after (b).

11. The etching method according to claim 1, wherein, in (a), top surfaces of the first and second regions are each exposed.

12. The etching method according to claim 1, wherein forming the deposit selectively on the first region and not on the second region with the first plasma generated from the first process gas containing the carbon monoxide gas includes:

removing oxygen from a surface of the substrate by striking the surface of the substrate with ions;

forming a dangling bond on the surface of the substrate; and adsorbing carbon monoxide on the surface of the substrate to form a carbon chemical species selectively on the first region and not on the second region.

13. The etching method according to claim 12, wherein the ions that strike the surface of the substrate have an energy value of 0 to 70 eV.

14. The etching method according to claim 1, wherein the first process gas contains carbonyl sulfide gas.

15. The etching method according to claim 1, wherein:

the first process gas comprises a mixture of the carbon monoxide gas and a hydrogen gas, and a ratio of a flow rate of the hydrogen gas to a total flow rate of the carbon monoxide gas and the hydrogen gas is from 1/19 to 2/17.

16. The etching method according to claim 1, wherein the first region is not etched during plasma etching of the second region while the first region is covered by the deposit.

* * * * *